US012176180B2

(12) United States Patent
Sawada et al.

(10) Patent No.: US 12,176,180 B2
(45) Date of Patent: Dec. 24, 2024

(54) METHOD FOR PRODUCING LAMELLA, ANALYSIS SYSTEM AND METHOD FOR ANALYZING SAMPLE

(71) Applicant: Hitachi High-Tech Corporation, Tokyo (JP)

(72) Inventors: Atsushi Sawada, Tokyo (JP); Tsunenori Nomaguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 332 days.

(21) Appl. No.: 17/773,433

(22) PCT Filed: Nov. 20, 2019

(86) PCT No.: PCT/JP2019/045433

§ 371 (c)(1),
(2) Date: Apr. 29, 2022

(87) PCT Pub. No.: WO2021/100144

PCT Pub. Date: May 27, 2021

(65) Prior Publication Data

US 2022/0367144 A1 Nov. 17, 2022

(51) Int. Cl.
*H01J 37/20* (2006.01)
*H01J 37/26* (2006.01)
(Continued)

(52) U.S. Cl.
CPC .............. *H01J 37/20* (2013.01); *H01J 37/26* (2013.01); *H01J 37/3053* (2013.01); (Continued)

(58) Field of Classification Search
CPC ........ H01J 37/20; H01J 37/26; H01J 37/3053; H01J 2237/0203; H01J 2237/208; H01J 2237/31745
See application file for complete search history.

(56) References Cited

U.S. PATENT DOCUMENTS 6,727,911 B1 4/2004 Yamada et al.
11,088,036 B2 * 8/2021 Hung ...................... H01L 22/14
2007/0184658 A1 8/2007 Koyata et al.
2010/0032567 A1 * 2/2010 Maclou Botman ... H01J 37/317 250/307
(Continued)

FOREIGN PATENT DOCUMENTS

JP 6-129962 A 5/1994
JP 2001-15058 A 1/2001
(Continued)

OTHER PUBLICATIONS

International Search Report (PCT/ISA/210) issued in PCT Application No. PCT/JP2019/045433 dated Dec. 24, 2019 with English translation (four (4) pages).
(Continued)

*Primary Examiner* — Nicole M Ippolito
(74) *Attorney, Agent, or Firm* — Crowell & Moring LLP

(57) ABSTRACT

A lamella 10 including an analysis portion 11 and a cutout portion 12 separated from the analysis portion 11 is produced. When a plurality of the lamellae 10 are transported to a lamella grid 20, the plurality of lamellae 10 are supported by a support portion 22 protruding from a surface of a substrate 21, and are mounted adjacent to each other in a Z direction. At this time, the cutout portion 12 prevents the analysis portion 11 from damage.

14 Claims, 18 Drawing Sheets

(51) Int. Cl.
*H01J 37/30* (2006.01)
*H01J 37/305* (2006.01)

(52) U.S. Cl.
CPC . *H01J 2237/0203* (2013.01); *H01J 2237/208* (2013.01); *H01J 2237/31745* (2013.01)

(56) References Cited

U.S. PATENT DOCUMENTS

| | | | | |
|---|---|---|---|---|
| 2015/0294834 | A1 | 10/2015 | Routh, Jr. et al. | |
| 2015/0369710 | A1* | 12/2015 | Fuller | C23C 16/50 427/595 |
| 2017/0097290 | A1 | 4/2017 | Krause et al. | |
| 2019/0378689 | A1* | 12/2019 | Brundage | C23F 4/00 |

FOREIGN PATENT DOCUMENTS

| | | | |
|---|---|---|---|
| JP | 2004-264145 | A | 9/2004 |
| JP | 2009-115582 | A | 5/2009 |
| JP | 2015-204296 | A | 11/2015 |
| JP | 2017-72596 | A | 4/2017 |
| KR | 10-2003-0016910 | A | 3/2003 |
| KR | 10-2004-0031279 | A | 4/2004 |
| KR | 10-2011-0108988 | A | 10/2011 |
| TW | 200723389 | A | 6/2007 |
| TW | 201903870 | A | 1/2019 |

OTHER PUBLICATIONS

Japanese-language Written Opinion (PCT/ISA/237) issued in PCT Application No. PCT/JP2019/045433 dated Dec. 24, 2019 (four (4) pages).

Taiwanese-language Office Action issued in Taiwanese Application No. 109136231 dated Jul. 30, 2021 (four (4) pages).

Korean-language Office Action issued in Korean Application No. 10-2022-7014384 dated Aug. 20, 2024 with English translation (9 pages).

* cited by examiner

[FIG. 1]
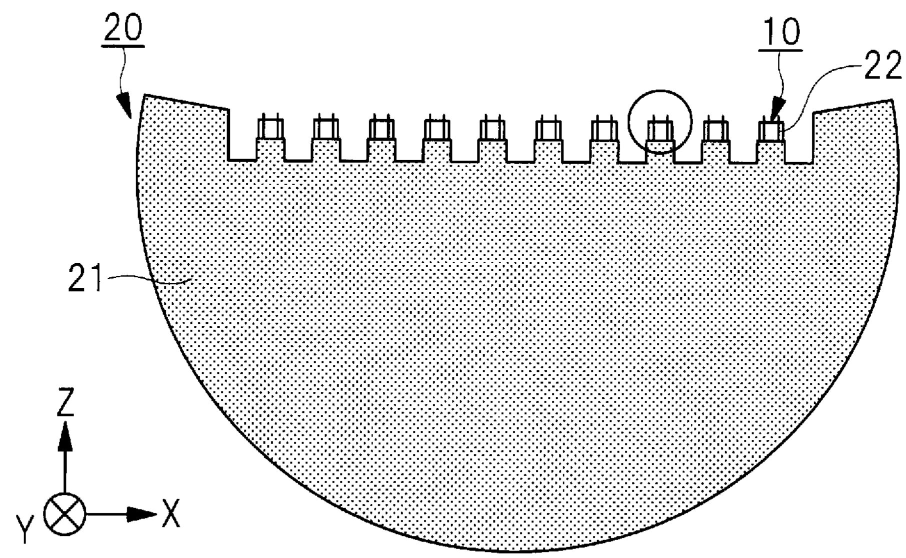
[FIG. 2]
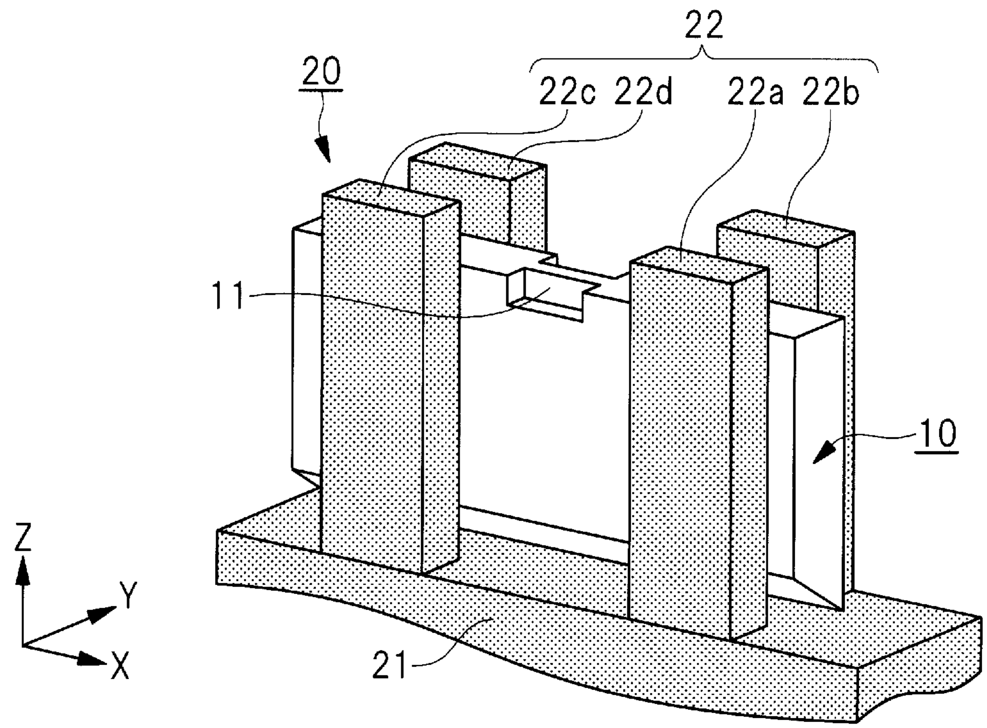

[FIG. 3]
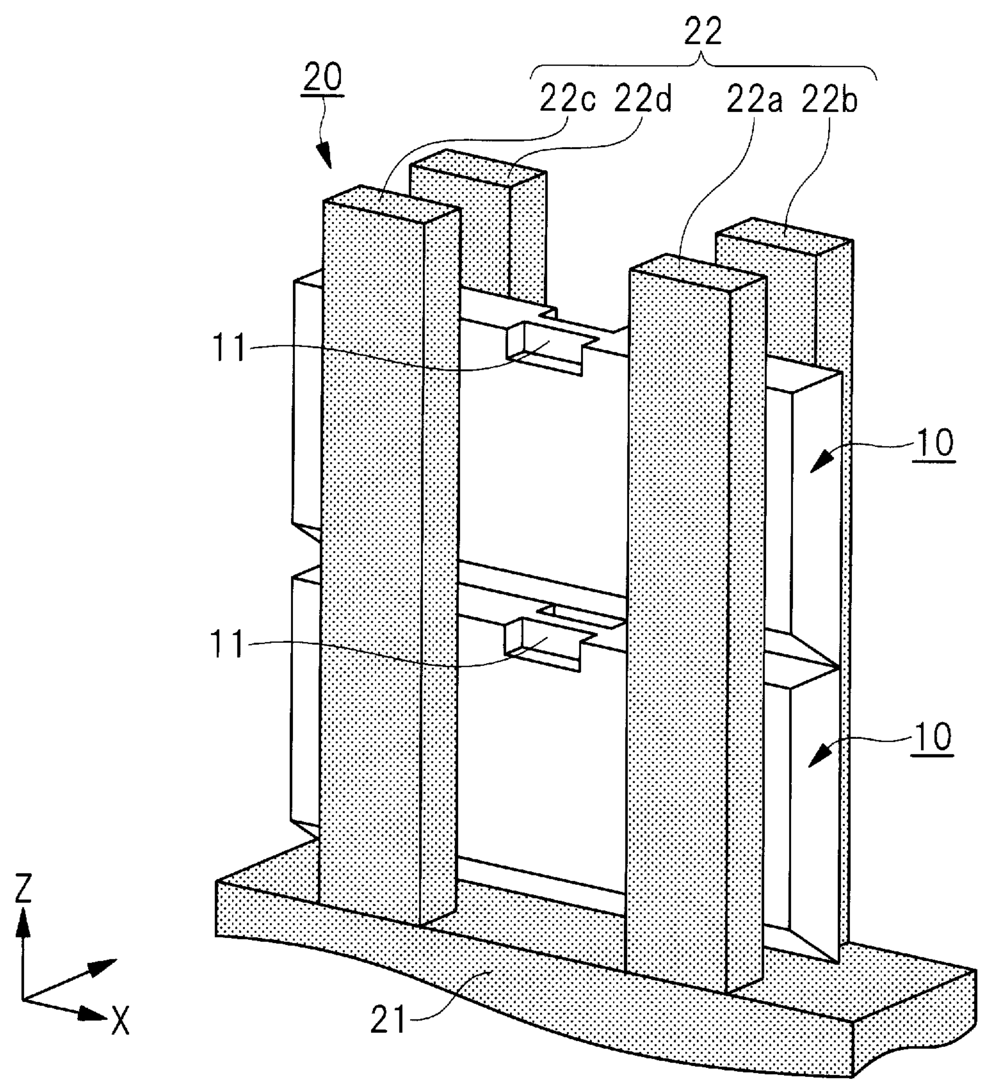

[FIG. 4]
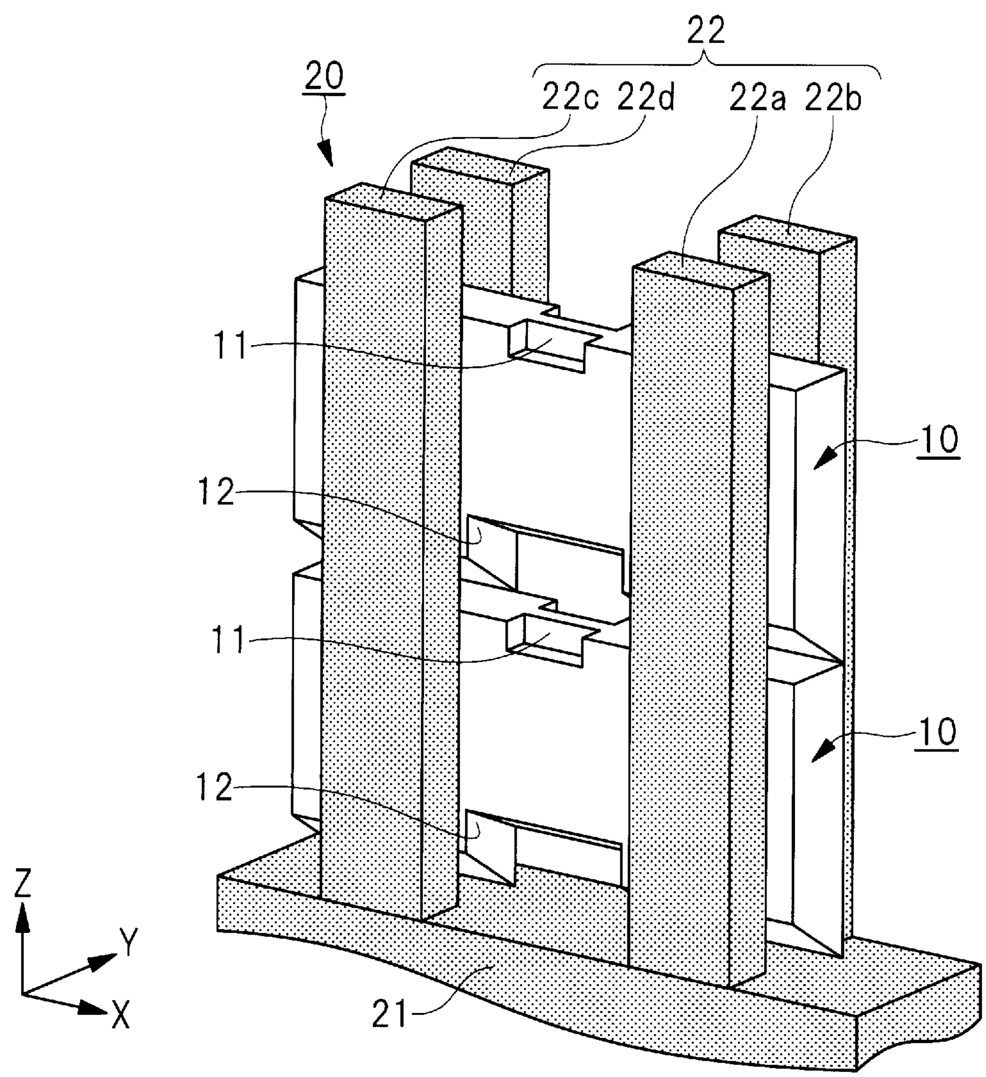

[FIG. 5]
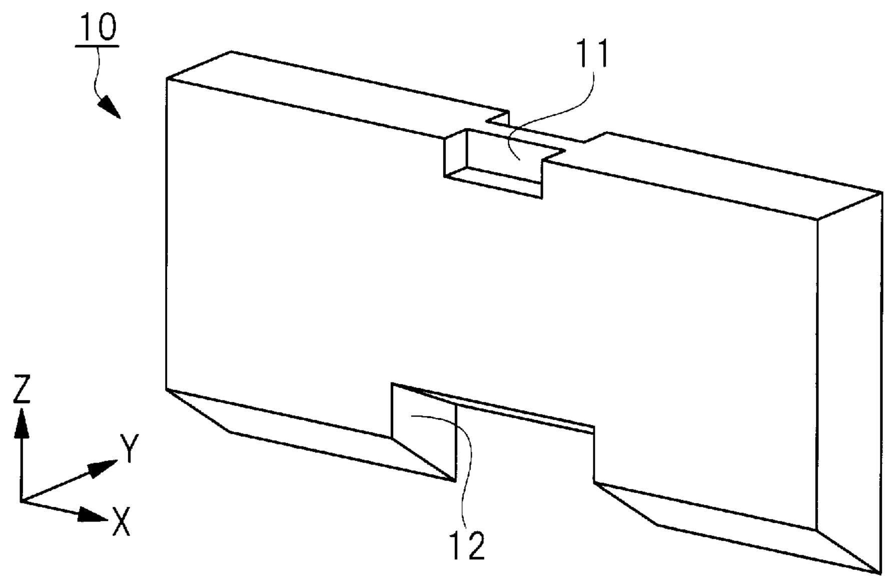
[FIG. 6]
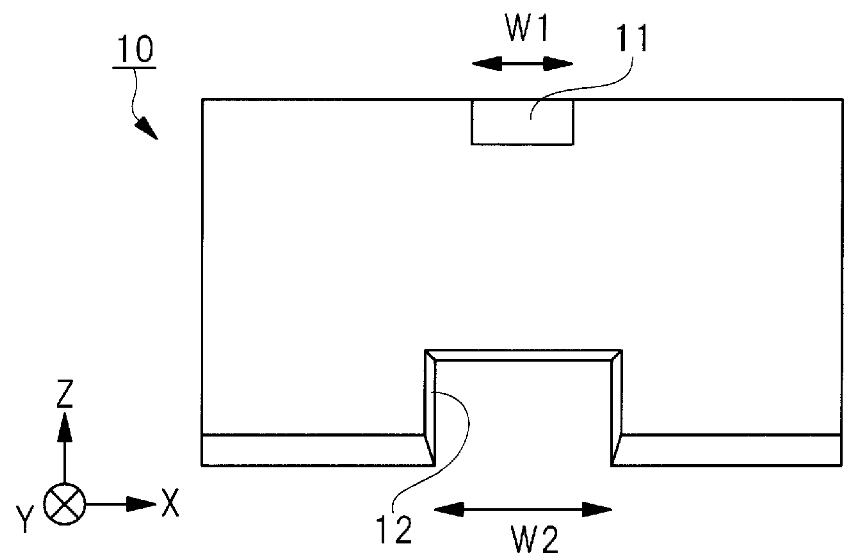
[FIG. 7]
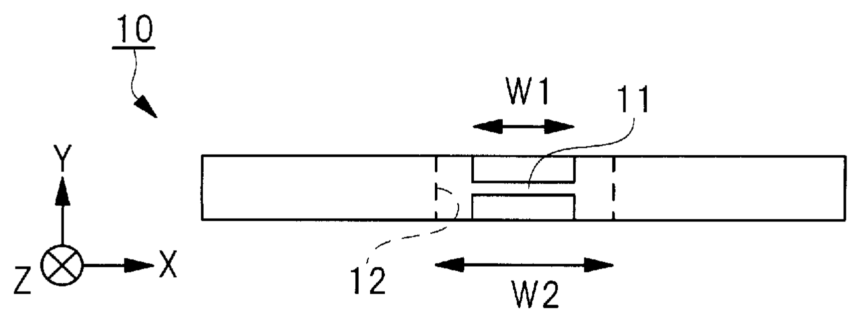

[FIG. 8]
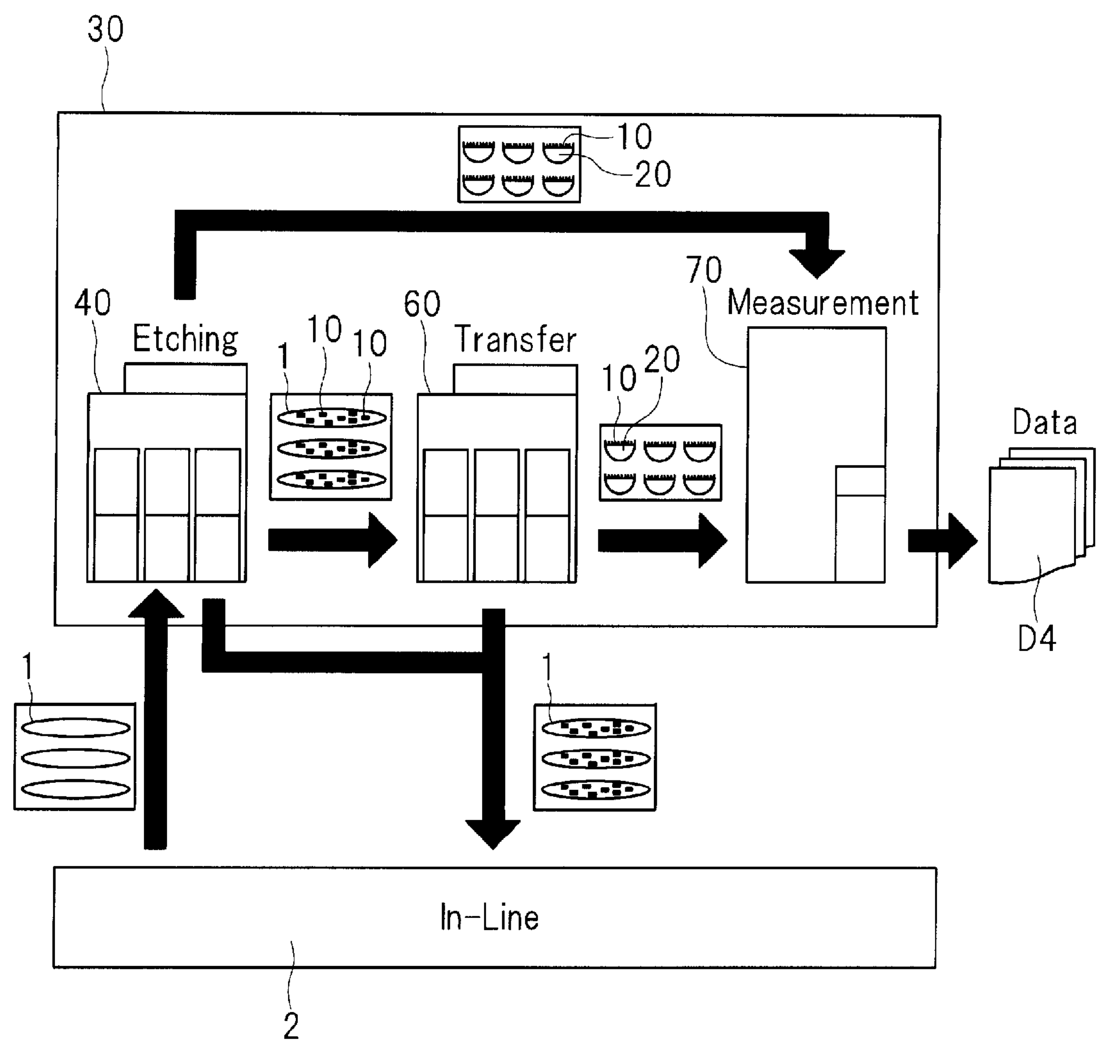

[FIG. 9]
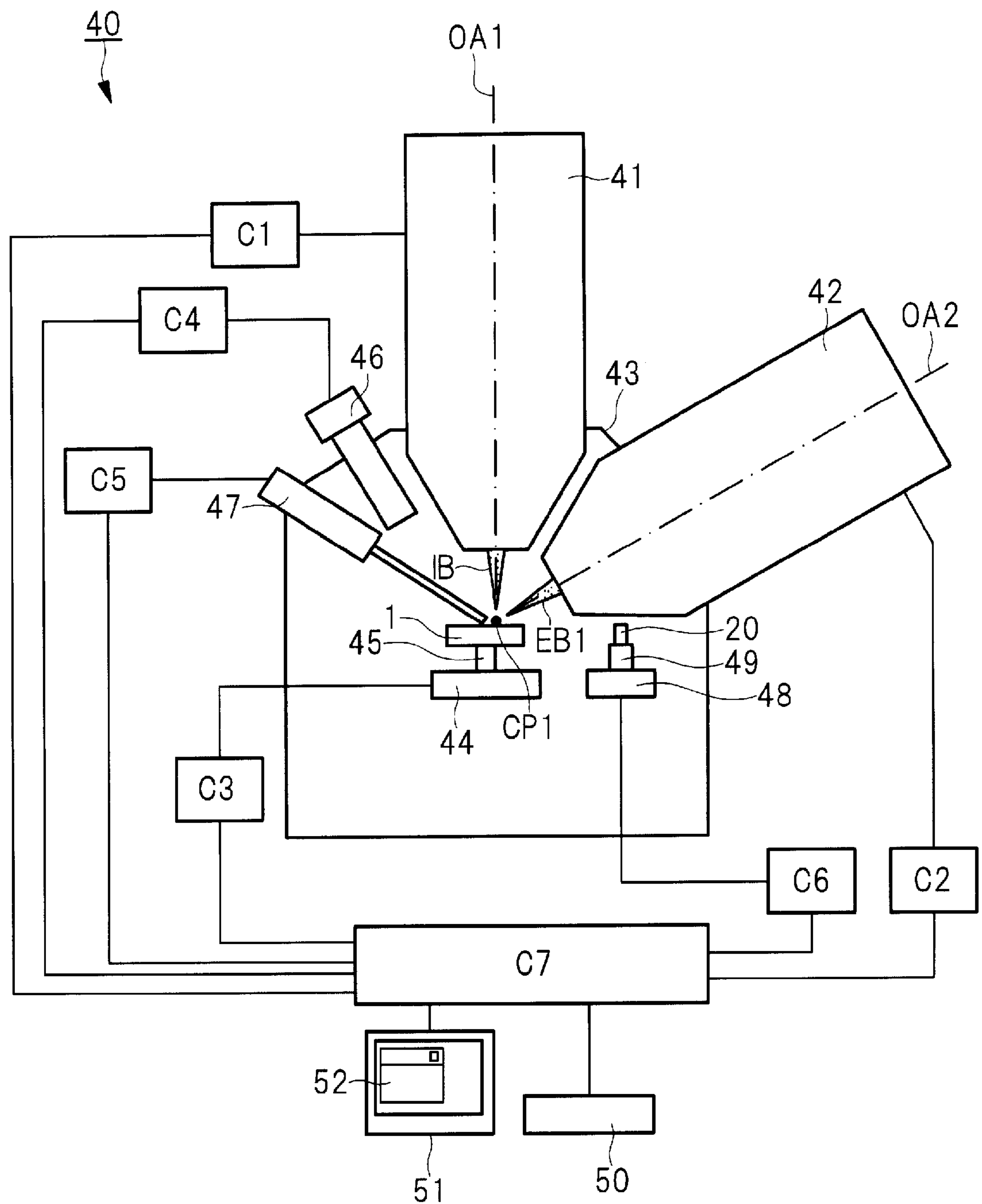

[FIG. 10]
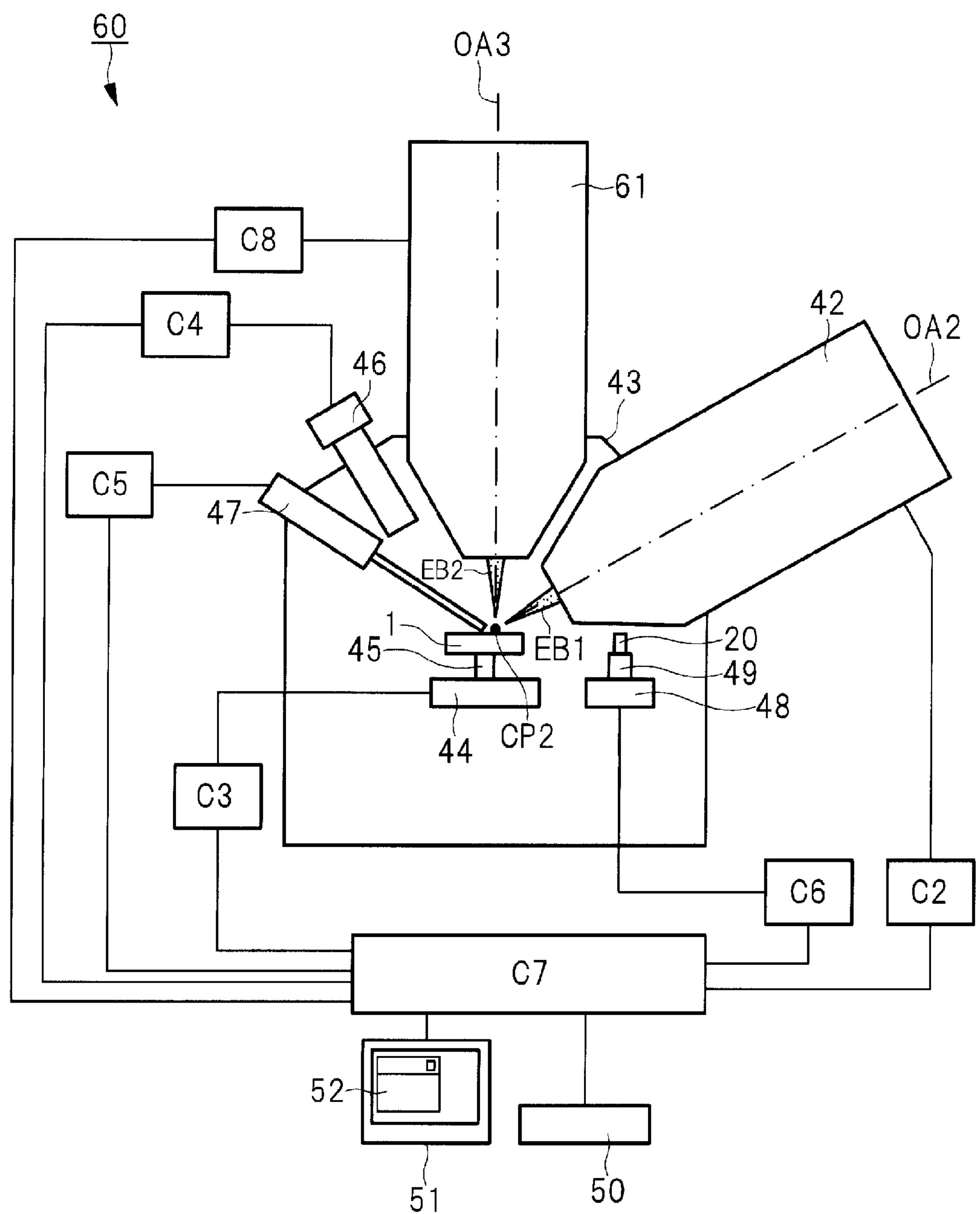

[FIG. 11]
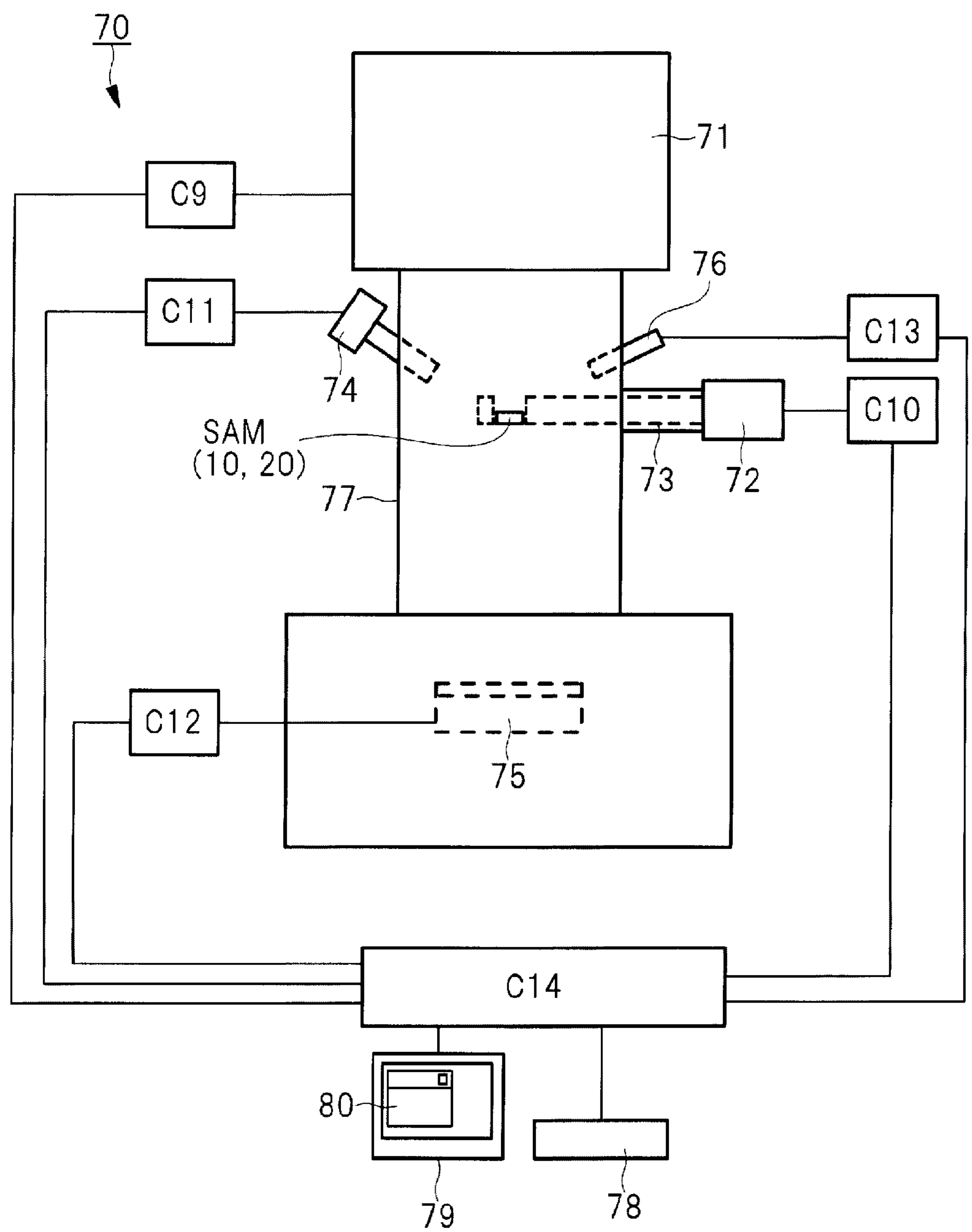

[FIG. 12]
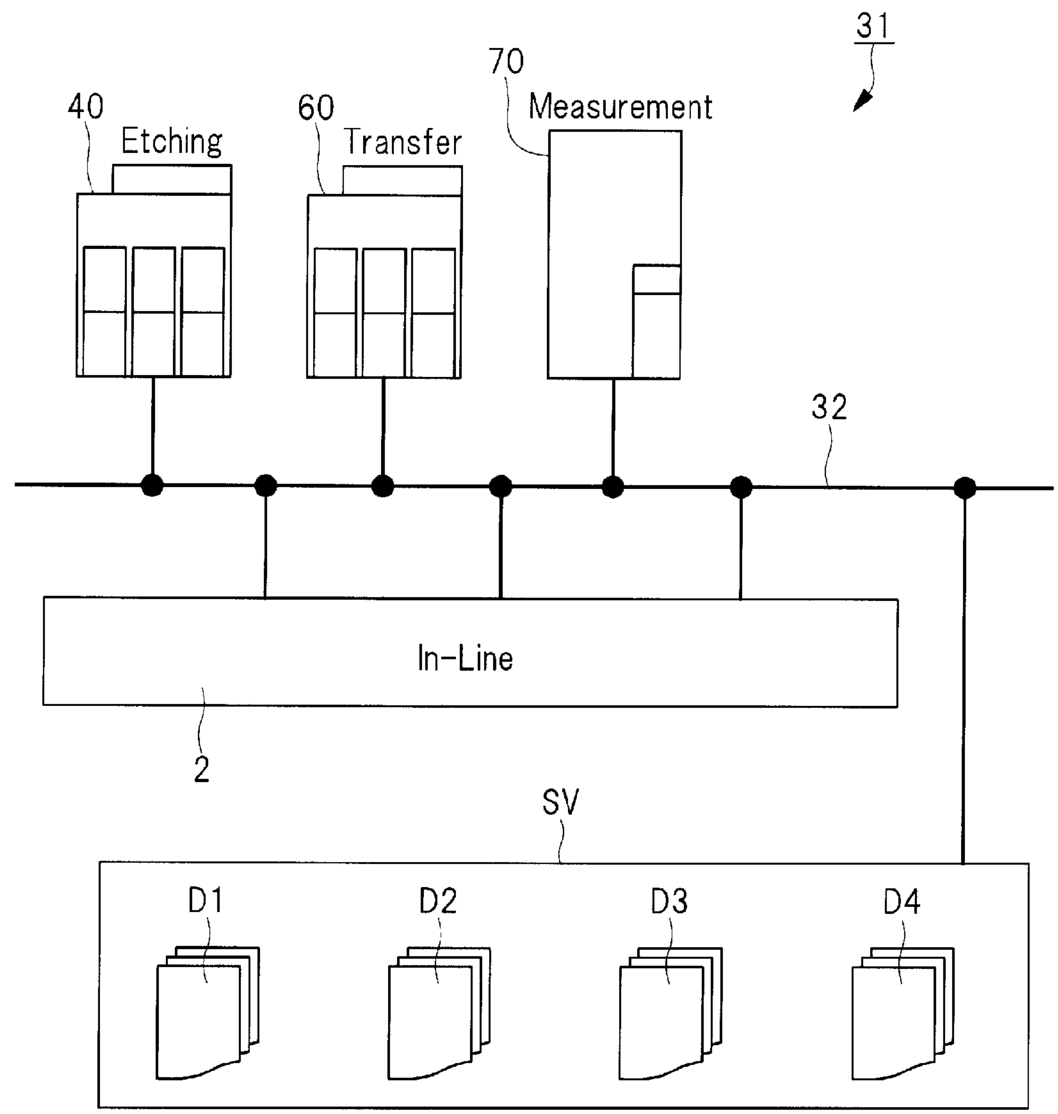

[FIG. 13]
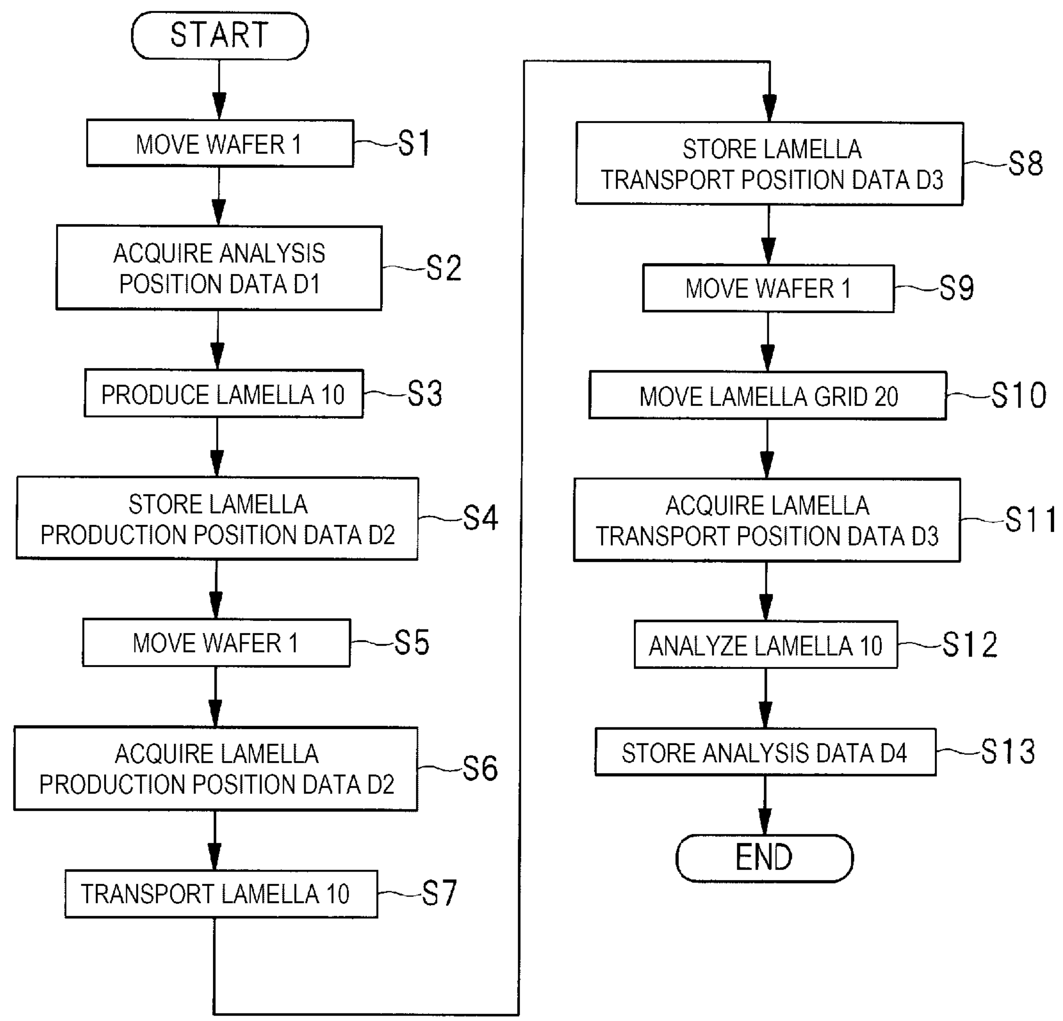

[FIG. 14]
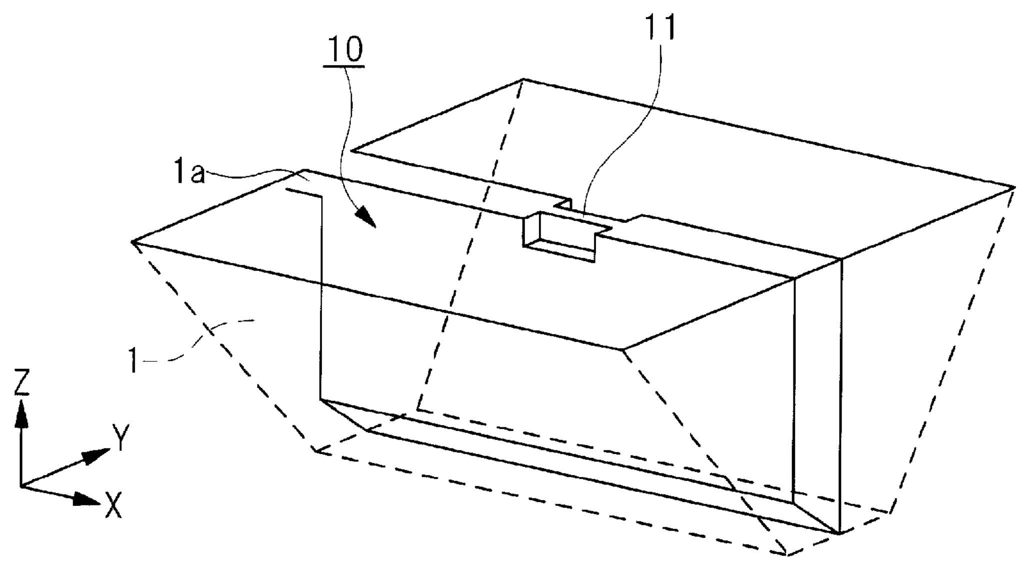
[FIG. 15]
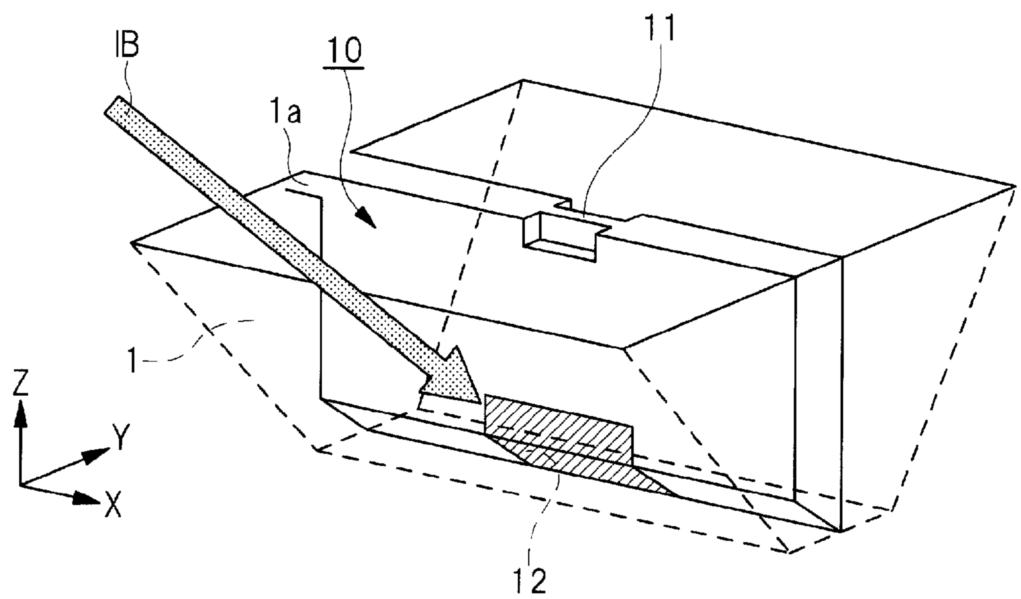

[FIG. 16]
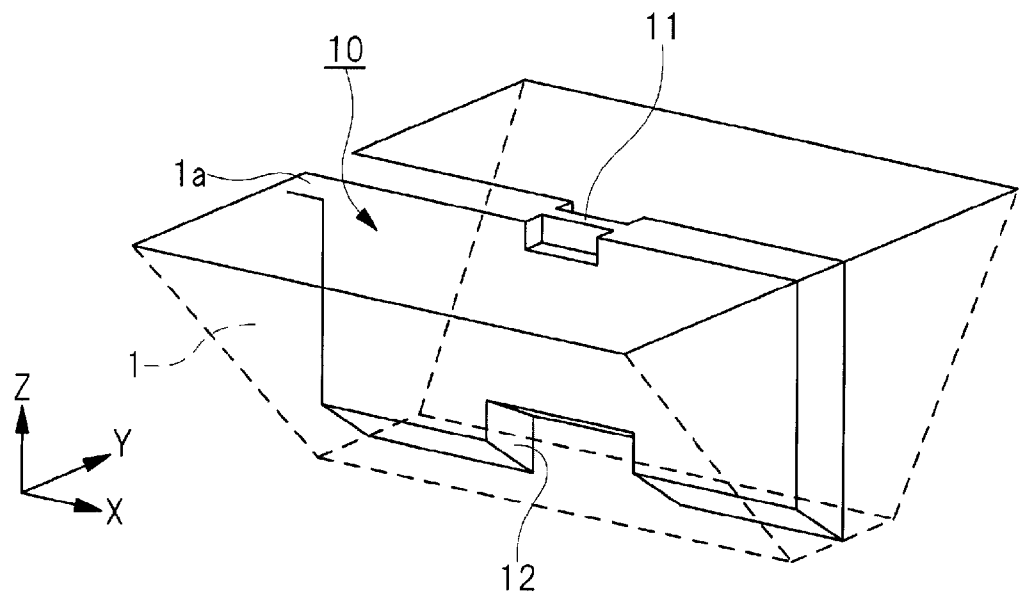
[FIG. 17]
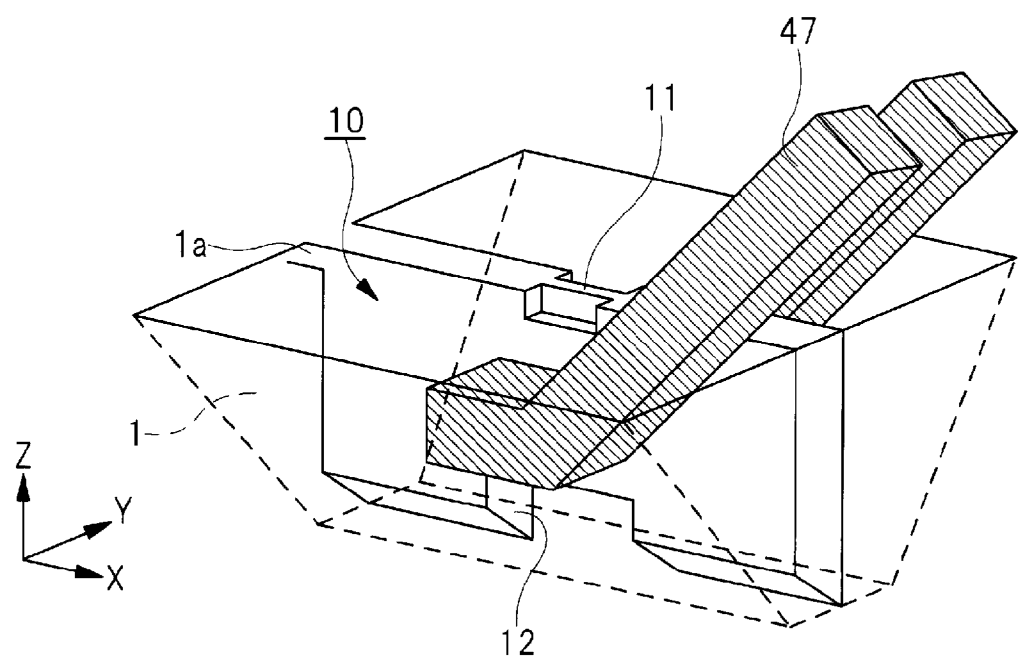

[FIG. 18]
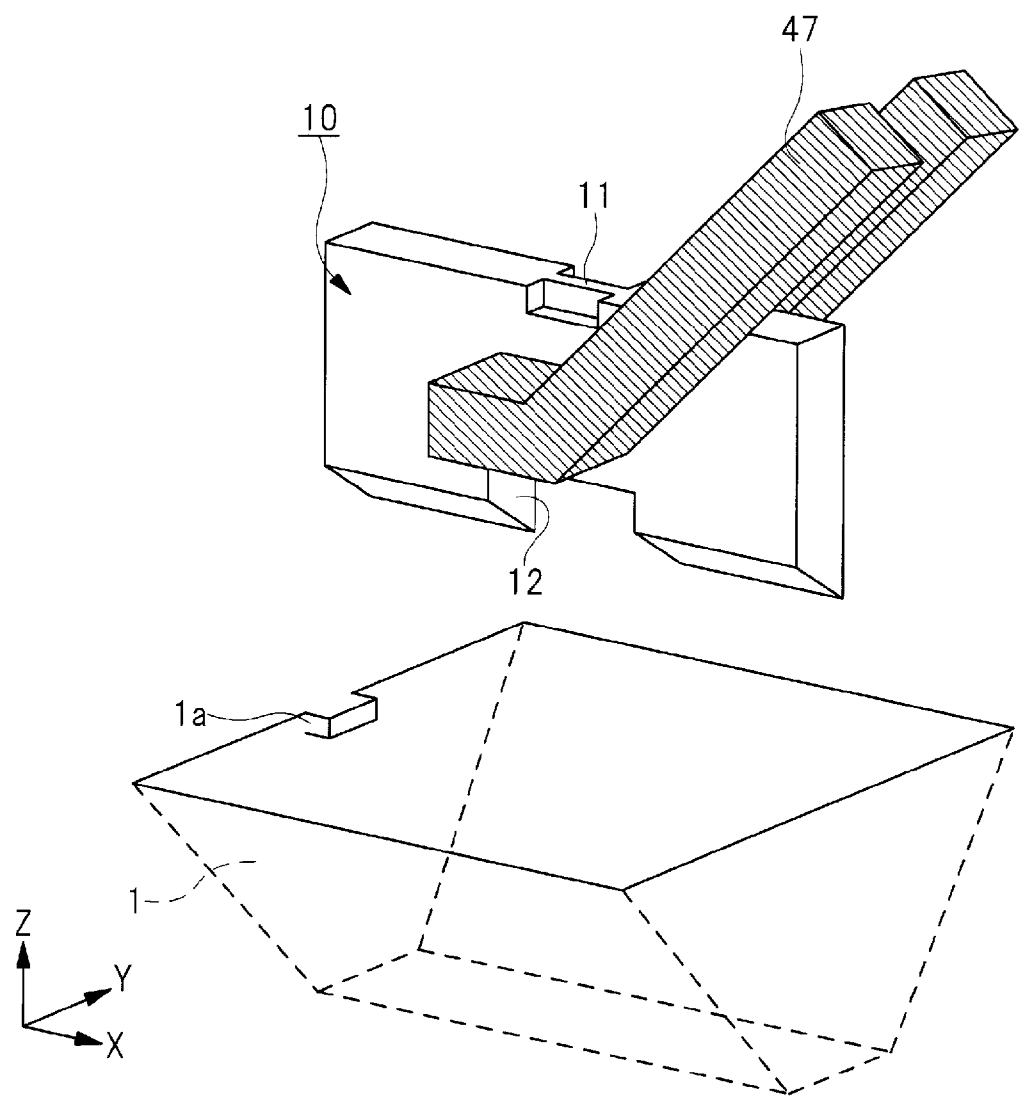

[FIG. 19]
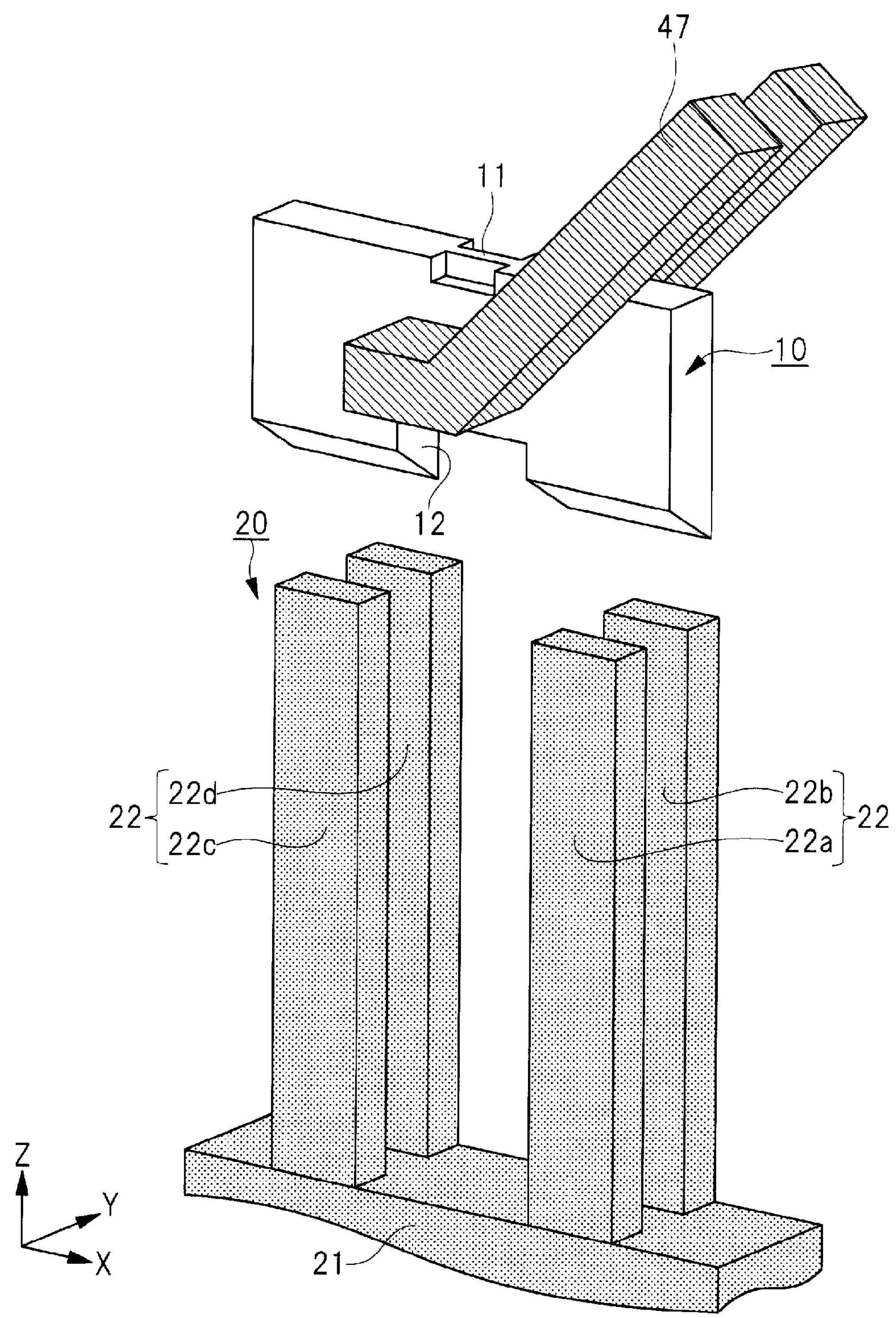

[FIG. 20]
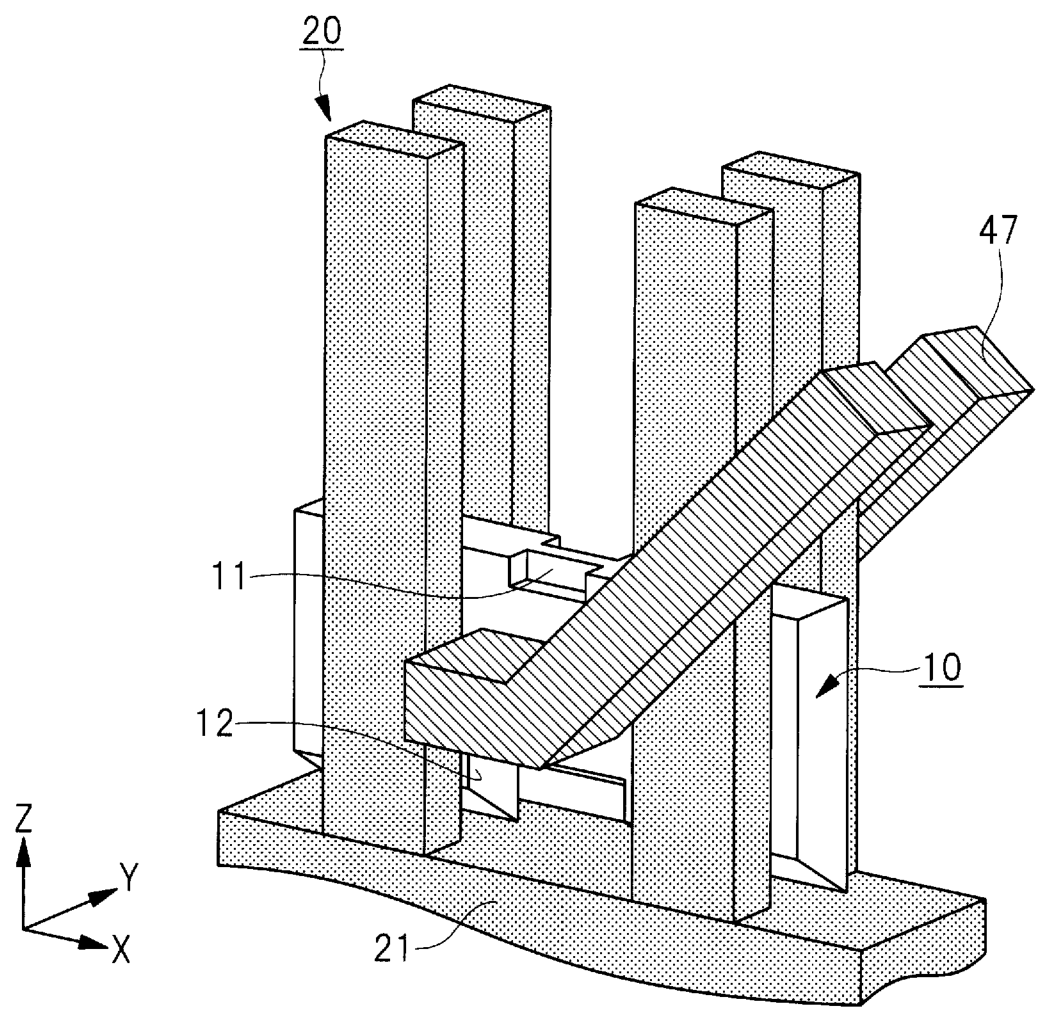

[FIG. 21]
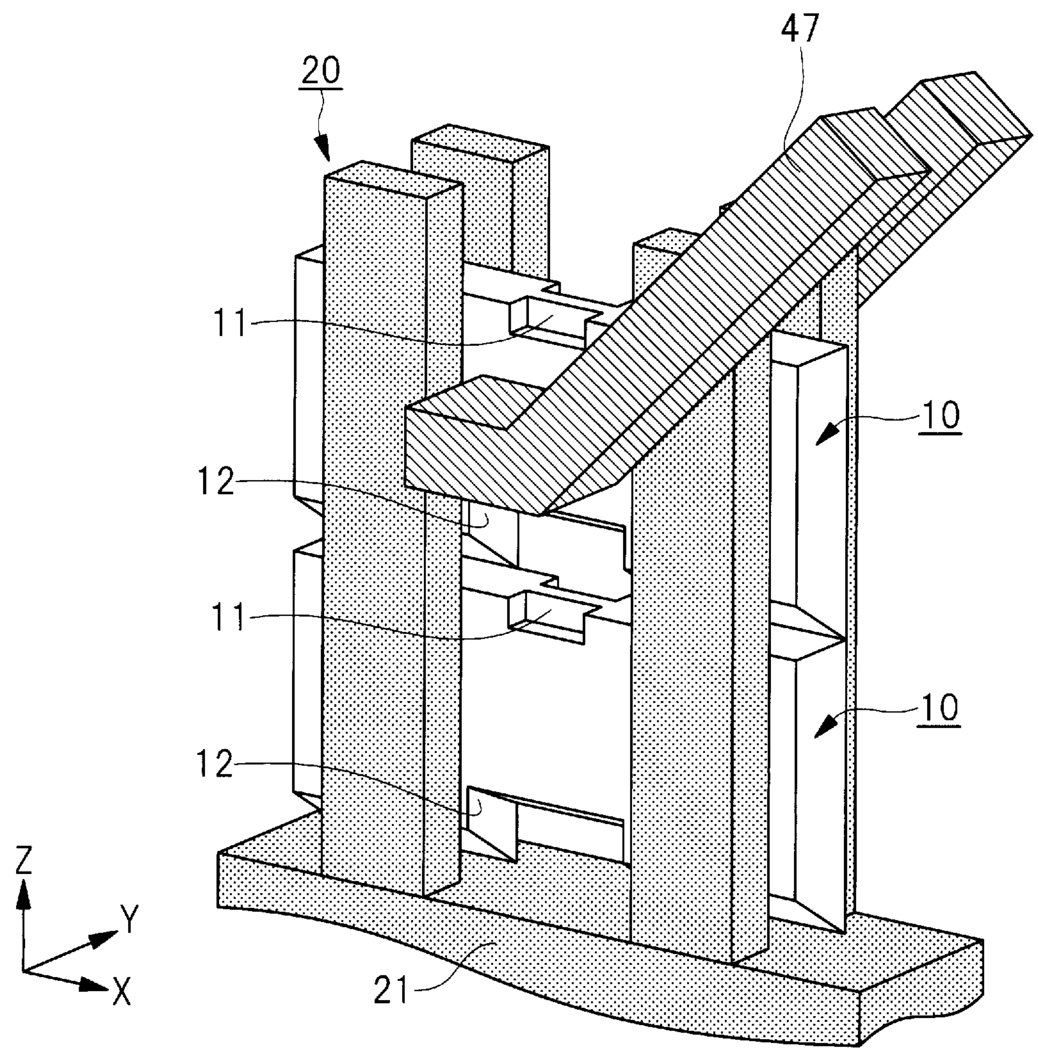

[FIG. 22]
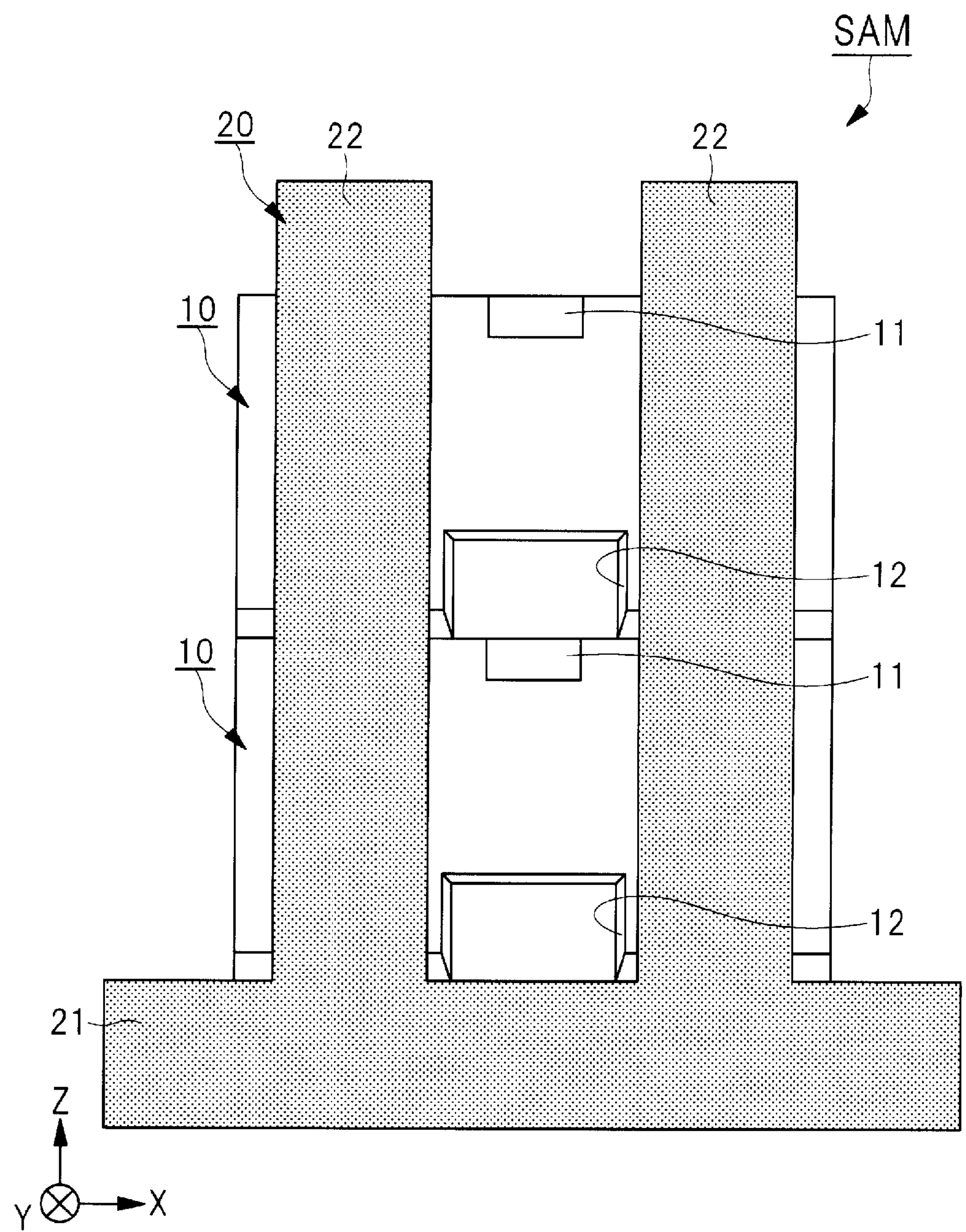

[FIG. 23]
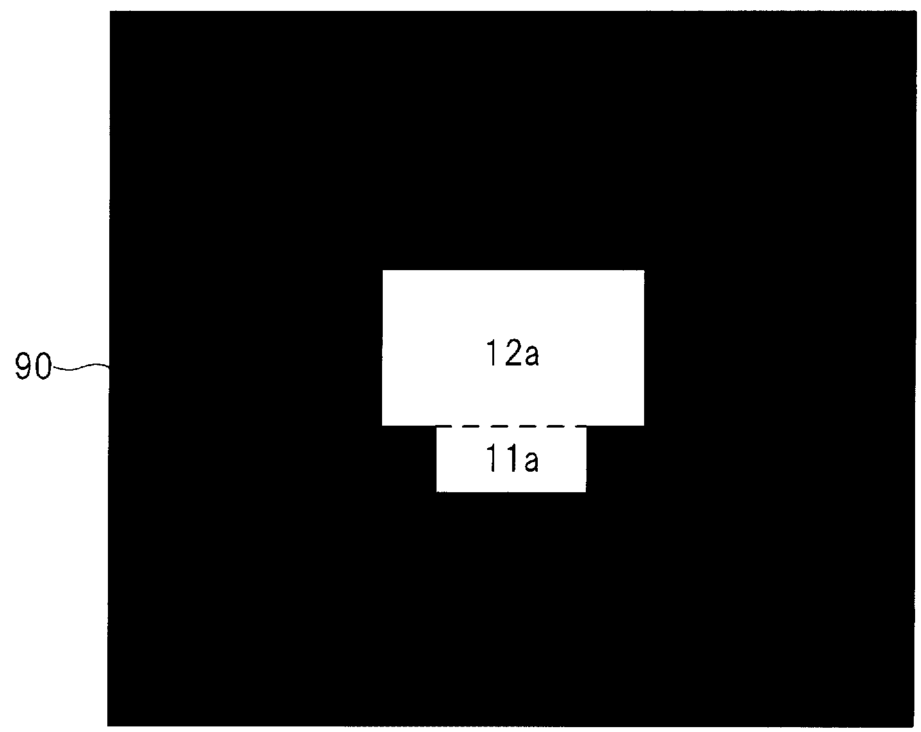

METHOD FOR PRODUCING LAMELLA, ANALYSIS SYSTEM AND METHOD FOR ANALYZING SAMPLE

TECHNICAL FIELD

The present invention relates to a method for producing a lamella, an analysis system, and a method for analyzing a sample, and in particular, can be suitably used for a method for producing a lamella including a cutout portion, an analysis system to which the lamella is applied, and a method for analyzing a sample to which the lamella is applied.

BACKGROUND ART

Performance of semiconductor devices has been improved by miniaturization according to Moore's Law. However, the limit of miniaturization is approaching in recent years, and attention is paid to techniques of utilizing a novel material in place of silicon such as a compound semiconductor or graphene, promoting a three-dimensional structure, and improving a device performance by a method other than the miniaturization.

Such new approaches increase an importance of a technique of analyzing interface states and stacked structures between different materials. For example, an analysis technique in related art includes surface observation using an optical microscope or surface observation using a scanning electron microscope (SEM). However, in these surface observations, accurate interface states and stacked structures are less likely to be analyzed.

Therefore, a method of preparing a lamella (thin sample) from a part of a wafer by a focused ion beam (FIB) device, transporting the lamella to a lamella grid by a lamella transport device or the FIB device, and analyzing the lamella on the lamella grid by a high-resolution electron microscope is performed. The high-resolution electron microscope (charged particle beam device) is, for example, a SEM, a transmission electron microscope (TEM), or a scanning transmission electron microscope (STEM).

On the other hand, in general, when the lamella is transported by the lamella grid, the lamella is fixed to the lamella grid by deposition. For example, PTL 1 discloses a technique of mounting a plurality of lamellae on one lamella grid by deposition. Further, PTL 2 discloses a method using a fitting shape as a method for fixing a lamella without deposition.

CITATION LIST

Patent Literature

PTL 1: JP-A-2015-204296
PTL 2: JP-A-2009-115582

SUMMARY OF INVENTION

Technical Problem

It is desired to evaluate quality of the wafer by automatically performing a series of flows for acquiring interface information and the stacked structures in the wafer. For example, if it is possible to construct an analysis system in which a plurality of lamellae are produced from one wafer, collectively mount the plurality of lamellae on one lamella grid, and collectively analyze the plurality of lamellae by the charged particle beam device, a throughput of the quality evaluation of the wafer can be improved.

In PTL 1, it is possible to transport a large number of lamellae, and the plurality of lamellae are fixed to the lamella grid by deposition. However, the deposition may take time and contaminate samples, and thus the method for fixing the lamella without deposition is desired in the quality evaluation of the wafer.

In PTL 2, since no deposition is used, the lamella can be transported in a short time, and sample contamination is also small. However, in order to transport the large number of lamellae, it is necessary to increase the number of support portions by the number of lamellae to be transported. In a commonly used lamella grid having a diameter of about 3 mm, only about 10 to 20 support portions can be provided. Therefore, the large number of lamellae are less likely to be transported by one lamella grid.

For the above reasons, a technique of transporting a plurality of lamellae by one lamella grid without deposition is desired, and a technique of improving a throughput of quality evaluation of a wafer is desired.

FIG. 1 is a front view showing an outline of a lamella 10 and a lamella grid 20 examined by the inventors of the present application. FIGS. 2 and 3 are perspective views showing main parts of the lamella 10 and the lamella grid 20 according to a first examination example and a second examination example, and show a structure in the vicinity of a support portion 22, which is a region surrounded by a circle in FIG. 1.

As shown in FIG. 1, the lamella grid 20 includes a half moon-shaped substrate 21 and a plurality of the support portions 22 protruding from a surface of the substrate 21 in a Z direction. The lamella 10 is mounted on each of the plurality of support portions 22.

In the first examination example shown in FIG. 2, one lamella 10 is mounted on one support portion 22. The support portion 22 includes support columns 22*a* to 22*d*, and the support columns 22*a* to 22*d* protrude from an upper surface of the substrate 21 in the Z direction. The lamella 10 is sandwiched between the support column 22*a* and the support column 22*b* and between the support column 22*c* and the support column 22*d*. In addition, an analysis portion 11 to be analyzed later in the charged particle beam device is provided on an upper portion of the lamella 10.

In the first examination example, as shown in FIG. 2, only one lamella 10 can be transported by one support portion 22. Therefore, the throughput of the quality evaluation of the wafer is less likely to be improved.

In the second examination example shown in FIG. 3, a plurality of the lamellae 10 (here, two lamellae 10) can be transported by increasing a height of the support portion 22. However, in a structure of the second examination example, since a bottom portion of the upper lamella 10 is in contact with the analysis portion 11 of the lower lamella 10, the analysis portion 11 may be damaged. In addition, at time of analysis performed by the charged particle beam device such as the TEM device, a material forming the bottom portion of the upper lamella 10 may interfere with the analysis of the analysis portion 11 of the lower lamella 10. For these reasons, an accurate observation image may be less likely to be acquired.

To summarize the above description, when the plurality of lamellae 10 are mounted on the lamella grid 20, a technique of producing the lamella 10 in a manner of preventing the analysis portion 11 from being damaged is desired. In addition, it is desired to construct an analysis system capable of producing and transporting such a lamella 10. Further, it is desired to construct an analysis method capable of acquiring a more accurate observation image when the produced lamella 10 is analyzed with the charged particle beam device.

Other problems and novel features will be apparent from a description of the description and the accompanying drawings.

Solution to Problem

An outline of a representative one of embodiments disclosed in the present application will be briefly described as follows.

A method for producing a lamella according to one embodiment includes producing the lamella including an analysis portion and a cutout portion by etching a part of a wafer. A width of the lamella in a first direction is smaller than a width of the lamella in a second direction orthogonal to the first direction and a width of the lamella in a third direction orthogonal to the first direction and the second direction, and a width of the analysis portion is smaller than a width of the lamella around the analysis portion in the first direction. In addition, the cutout portion includes a hole penetrating the lamella in the first direction, and the analysis portion and the cutout portion are separated from each other in the second direction.

An analysis system according to one embodiment includes a lamella production mechanism and a lamella transport mechanism. The analysis system is configured to: (a) produce a first lamella including at least a first analysis portion and a first cutout portion and a second lamella including a second analysis portion and a second cutout portion by etching a part of a wafer in the lamella production mechanism; and (b) sequentially transport the first lamella and the second lamella from the wafer to a lamella grid in the lamella transport mechanism. A width of the first lamella in a first direction is smaller than a width of the first lamella in a second direction orthogonal to the first direction and a width of the first lamella in a third direction orthogonal to the first direction and the second direction, and a width of the first analysis portion is smaller than a width of the first lamella around the first analysis portion in the first direction. In addition, the first cutout portion includes a hole penetrating the first lamella in the first direction, the first analysis portion and the first cutout portion are separated from each other in the second direction, and a width of the second lamella in the first direction is smaller than a width of the second lamella in the second direction and a width of the second lamella in the third direction. In addition, a width of the second analysis portion is smaller than a width of the second lamella around the second analysis portion in the first direction, the second cutout portion includes a hole penetrating the second lamella in the first direction, and the second analysis portion and the second cutout portion are separated from each other in the second direction. In addition, the lamella grid includes a substrate and a support portion that protrudes from a surface of the substrate in the second direction and on which the first lamella and the second lamella are configured to be mounted, and in the (b), the first lamella and the second lamella are transported to the lamella grid such that the second cutout portion and the first analysis portion are adjacent to each other in the second direction and overlap each other in a plan view seen from the second direction.

A method for analyzing a sample according to one embodiment is performed using a transmission electron microscope. The method includes: (a) arranging the sample including an analysis target portion on a sample stage of the transmission electron microscope; (b) acquiring an image of the sample at a low magnification after the (a), and specifying a position of the analysis target portion of the sample based on the image; and (c) analyzing the analysis target portion of the sample at a high magnification after the (b). The image acquired in the (b) has a dark region and a bright region surrounded by the dark region, the bright region includes a first region and a second region having an area smaller than an area of the first region and in contact with the first region, and a position of the second region protruding from the first region is specified as the position of the analysis target portion by searching for the second region along a boundary between the first region and the dark region.

Advantageous Effect

According to one embodiment, one lamella grid can transport a plurality of lamellae, and a throughput of quality evaluation of a wafer can be improved. At this time, it is possible to produce the lamella that prevents damage of an analysis portion. In addition, it is possible to provide an analysis system capable of producing and transporting such a lamella. In addition, in a method for analyzing a sample to which such a lamella is applied, a more accurate observation image can be acquired.

BRIEF DESCRIPTION OF DRAWINGS

FIG. 1 is a front view showing a lamella and a lamella grid according to a first embodiment, a first examination example, and a second examination example.

FIG. 2 is a perspective view showing a main part of the lamella and the lamella grid according to the first examination example.

FIG. 3 is a perspective view showing a main part of the lamella and the lamella grid according to the second examination example.

FIG. 4 is a perspective view showing a main part of the lamella and the lamella grid according to the first embodiment.

FIG. 5 is a perspective view showing a main part of the lamella according to the first embodiment.

FIG. 6 is a front view showing the lamella according to the first embodiment.

FIG. 7 is a plan view showing the lamella according to the first embodiment.

FIG. 8 is a schematic diagram showing an analysis system according to the first embodiment.

FIG. 9 is a schematic diagram showing a lamella production mechanism according to the first embodiment.

FIG. 10 is a schematic diagram showing a lamella transport mechanism according to the first embodiment.

FIG. 11 is a schematic diagram showing a lamella analysis mechanism according to the first embodiment.

FIG. 12 is a schematic diagram showing a network configuration according to the first embodiment.

FIG. 13 is a processing flow chart of the analysis system according to the first embodiment.

FIG. 14 is a perspective view showing a main part of a method for producing the lamella according to the first embodiment.

FIG. 15 is a perspective view showing a main part of the method for producing the lamella following FIG. 14.

FIG. 16 is a perspective view showing a main part of the method for producing the lamella following FIG. 15.

FIG. 17 is a perspective view showing a main part of a method for transporting the lamella according to the first embodiment.

FIG. 18 is a perspective view showing a main part of the method for transporting the lamella following FIG. 17.

FIG. 19 is a perspective view showing a main part of the method for transporting the lamella following FIG. 18.

FIG. 20 is a perspective view showing a main part of the method for transporting the lamella following FIG. 19.

FIG. 21 is a perspective view showing a main part of the method for transporting the lamella following FIG. 20.

FIG. 22 is a front view showing a method for analyzing a lamella according to the first embodiment.

FIG. 23 shows an example of an image showing the method for analyzing the lamella according to the first embodiment.

DESCRIPTION OF EMBODIMENTS

Hereinafter, an embodiment will be described in detail with reference to the drawings. In all the drawings showing the embodiment, members having the same functions are denoted by the same reference numerals, and repeated descriptions thereof will be omitted. In the following embodiment, description of the same or similar portions will not be repeated in principle unless necessary.

An X direction, a Y direction, and a Z direction described in the present application are orthogonal to one another. In the present application, the Z direction may be described as an upward direction or a height direction of a certain structure. In addition, a plane having the X direction and the Y direction defines a plane perpendicular to the Z direction. A plane having the Y direction and the Z direction defines a plane perpendicular to the X direction. A plane having the X direction and the Z direction defines a plane perpendicular to the Y direction. For example, in the present application, a term "a plan view seen from the Y direction" means to see the plane having the X direction and the Z direction from the Y direction.

First Embodiment

<Structures of Lamella 10 and Lamella Grid 20>

Rough structures of the lamella 10 and the lamella grid 20 according to the first embodiment are as shown in FIG. 1. FIG. 4 is a perspective view of a main part in a state in which two lamellae 10 are mounted on the lamella grid 20. FIGS. 5 to 7 are a perspective view, a front view, and a plan view showing a main part of the structure of one lamella 10, respectively. As shown in FIG. 4, although two lamellae 10 are exemplified in the first embodiment, three or more lamellae 10 can be mounted on the lamella grid 20.

As shown in FIG. 1, the lamella grid (TEM grid, lamella carrier) 20 includes a half moon-shaped substrate 21 and a plurality of support portions (gap portions) 22 protruding from a surface of the substrate 21 in the Z direction. A plurality of the lamellae 10 are mounted on each of the plurality of support portions 22. The substrate 21 including the plurality of support portions 22 may be made of, for example, a single material such as silicon. Alternatively, a portion of the substrate 21 where the plurality of support portions 22 are provided and a periphery thereof may be made of a material different from the material constituting the substrate 21. For example, most of the substrate 21 may be made of copper, and the plurality of support portions 22 and the periphery thereof may be made of silicon.

As shown in FIG. 4, the support portion 22 includes support columns **22*a* to 22*d*, and the support columns 22*a* to 22*d* protrude from the surface of the substrate 21 in the Z direction and extend in the Z direction. The lamella 10 is supported by the support portion 22 defining the gap portion. Specifically, the lamella 10 is sandwiched between the support column 22*a* and the support column 22*b* and between the support column 22*c* and the support column 22*d*. The support portion 22 can support the plurality of lamellae 10, and here two lamellae 10 are adjacent to each other in the Z direction and are supported by the support portion 22**.

The support columns **22*a* and 22*b* are separated from each other in the Y direction, and the support columns 22*c* and 22*d* are separated from each other in the Y direction. In addition, the support columns 22*a* and 22*b* are separated from the support columns 22*c* and 22*d*** in the X direction.

One lamella grid 20 is provided with 4 to 20 support portions 22 including the support columns **22*a* to 22*d*. According to the first embodiment, a case in which the support columns 22*a* to 22*d* are quadrangular columns is shown. Alternatively, the support columns 22*a* to 22*d* may have any shape as long as the support columns 22*a* to 22*d* can support the lamella 10**, and may have a polygonal column other than a square, or may have a columnar body.

As shown in FIGS. 4 to 7, the lamella 10 is a thin-piece sample whose width in the Y direction is smaller than a width in the X direction and a width in the Z direction, and is produced by etching a part of a wafer 1 as described later. An analysis portion 11 is provided on an upper portion of the lamella 10 in the Z direction. The analysis portion 11 is a region to be analyzed later in a lamella analysis mechanism, and a width of the analysis portion 11 is smaller than a width of the lamella 10 around the analysis portion 11 in the Y direction. The lamella 10 is mounted on the lamella grid 20 such that the analysis portion 11 does not overlap the support portion 22 (support columns **22*a* to 22*d***) in the plan view seen from the Y direction.

A cutout portion 12 is provided at a lower portion of the lamella 10 in the Z direction so as to be separated from the analysis portion 11. The cutout portion 12 includes a hole penetrating the lamella 10 in the Y direction.

A width W2 of the cutout portion 12 is larger than a width W1 of the analysis portion 11 in the X direction. As shown in FIG. 7, the analysis portion 11 overlaps the cutout portion 12 in a plan view seen from the Z direction. In other words, the analysis portion 11 is included in the cutout portion 12 in the plan view seen from the Z direction.

The plurality of lamellae 10 are sequentially transported to the lamella grid 20 so as to be adjacent to each other in the Z direction. In addition, the cutout portion 12 of the upper lamella 10 and the analysis portion 11 of the lower lamella 10 are adjacent to each other in the Z direction and overlap each other in the plan view seen from the Z direction. Since the cutout portion 12 is provided on the lamella 10, the upper lamella 10 is not in contact with the analysis portion 11 of the lower lamella 10.

Therefore, if the lamella 10 according to the first embodiment is used, the plurality of lamellae 10 can be mounted on the lamella grid 20, and the analysis portion 11 can be prevented from damage. In addition, according to the first embodiment, since no deposition is used at time of mounting the lamella 10 on the lamella grid 20, the lamella 10 can be transported in a short time and sample contamination is also small.

When the analysis is performed by the lamella analysis mechanism, the analysis is performed in a state in which the plurality of lamellae 10 are mounted on the lamella grid 20. Therefore, the analysis portion 11 does not overlap the support portion 22 and is exposed from the support portion 22 in the plan view seen from the Y direction so that the analysis portion 11 is not blocked by the support portion 22. In addition, the cutout portion 12 also does not overlap the support portion 22 and is exposed from the support portion 22 in the plan view seen from the Y direction. Alternatively, if the analysis portion 11 does not overlap the support portion 22, a part of the cutout portion 12 may overlap the support portion 22.

No other lamella 10 (analysis portion 11) is present below the lamella 10 located at the lowermost position of the lamella grid 20. Therefore, the lowermost lamella 10 may not be necessarily provided with the cutout portion 12. However, when the lamella 10 including the cutout portion 12 and the lamella 10 including no cutout portion 12 are separately produced, a step of producing the lamella 10 becomes complicated. Further, it is necessary to first transport the lamella 10 including no cutout portion 12 and a transport order is limited, and thus a step of transporting the lamella 10 becomes complicated. Therefore, it is most desirable to provide the cutout portion 12 in all the lamellae 10.

<Configuration of Analysis System>

Hereinafter, a configuration of an analysis system 30 capable of producing, transporting, and analyzing the lamella 10 will be described with reference to FIGS. 8 to 11. FIG. 8 is a schematic diagram showing the analysis system 30 according to the first embodiment. The analysis system 30 includes a lamella production mechanism, a lamella transport mechanism, and a lamella analysis mechanism. As shown in FIG. 8, a lamella production device 40 is used as the lamella production mechanism, the lamella production device 40 or a lamella transport device 60 is used as the lamella transport mechanism, and a lamella analysis device 70 is used as the lamella analysis mechanism.

The analysis system 30 receives the wafer 1 from a semiconductor manufacture line 2, and returns the wafer 1 that completed the production and the transport of the lamella 10 to the semiconductor manufacture line 2. As will be described in detail later, the lamella 10 is produced by the lamella production device 40, and the transport of the lamella 10 to the lamella grid 20 is performed by the lamella production device 40 or the lamella transport device 60. Thereafter, the lamella 10 is analyzed by the lamella analysis device 70, and an analysis result of the lamella 10 is provided as analysis data D4.

When a transfer operation between the semiconductor manufacture line 2, the lamella production device 40, the lamella transport device 60, and the lamella analysis device 70 is performed, the wafer 1, the lamella 10, and the lamella grid 20 are stored inside a container (FOUP) filled with an inert gas such as nitrogen, and are taken out from the container inside each device after the transfer is completed.

The wafer 1 according to the first embodiment includes a semiconductor substrate on which a p-type or n-type impurity region is formed, a semiconductor element such as a transistor formed on the semiconductor substrate, a wiring layer formed on the semiconductor element, and the like. Since the lamella 10 is a thin piece obtained from a part of the wafer 1, the structure of the lamella 10 includes all or a part of the semiconductor substrate, the semiconductor element, and the wiring layer. In addition, according to the first embodiment, the wafer 1 mainly used in the semiconductor manufacture line is described, and the wafer 1 may have a structure used in other than a semiconductor technique.

Hereinafter, detailed structures of the lamella production device 40, the lamella transport device 60, and the lamella analysis device 70, which are main components of the analysis system 30, will be described.

<Lamella Production Device>

FIG. 9 is a schematic diagram showing the lamella production device 40 according to the first embodiment. The lamella production device 40 includes at least the lamella production mechanism, and is implemented by a charged particle beam device such as an FIB-SEM device.

The lamella production device 40 includes an ion beam column 41, an electron beam column 42, a sample chamber 43, a wafer stage 44, a wafer holder 45, a charged particle detector 46, a detacher 47, a lamella grid stage 48, a lamella grid holder 49, and control units C1 to C7. In addition, an input device 50 and a display 51 are provided inside or outside the lamella production device 40.

The ion beam column 41 includes all components necessary for the FIB device, such as an ion source for generating an ion beam (charged particle beam) IB, a lens for focusing the ion beam IB, and a deflection system for performing scanning with the ion beam IB and shifting the ion beam IB. Although gallium ions are generally used as the ion beam IB, ion species may be appropriately changed depending on a purpose of processing and observation. In addition, the ion beam IB is not limited to a focused ion beam, and may be a broad ion beam.

The ion beam column control unit C1 controls the ion beam column 41. For example, the generation of the ion beam IB from the ion source and the driving of the deflection system are controlled by the ion beam column control unit C1.

The electron beam column 42 includes all components necessary for the SEM device, such as an electron source for generating an electron beam (charged particle beam) EB1, a lens for focusing the electron beam EB1, and a deflection system for performing scanning with the electron beam EB1 and shifting the electron beam EB1.

The electron beam column control unit C2 controls the electron beam column 42. For example, the generation of the electron beam EB1 from the electron source and the driving of the deflection system are controlled by the electron beam column control unit C2.

The ion beam IB that passed through the ion beam column 41 and the electron beam EB1 that passed through the electron beam column 42 are focused mainly at a cross point CP1 that is an intersection point of an optical axis OA1 of the ion beam column and an optical axis OA2 of the electron beam column.

According to the first embodiment, although the ion beam column 41 is vertically arranged and the electron beam column is arranged in an inclined manner, the invention is not limited thereto, and the ion beam column 41 may be arranged in an inclined manner and the electron beam column 42 may be vertically arranged. Further, both the ion beam column 41 and the electron beam column 42 may be arranged in the inclined manner.

Instead, the ion beam column 41 and the electron beam column 42 may be implemented by a triple column including a gallium focused ion beam column, an argon focused ion beam column, and an electron beam column.

The lamella production device 40 may include only the ion beam column 41 or may include only the electron beam column 42. In other words, if the wafer 1 can be processed and observed, the lamella production device 40, which is the charged particle beam device, may include either or both of the ion beam column and the electron beam column 42. That is, the charged particle beam device may include a charged particle beam column. In addition, the electron beam column 42 is not limited to the SEM device, and may be a TEM device or an STEM device for observation using electrons transmitted through a sample.

The wafer stage 44 is provided in the sample chamber 43 at a position where the wafer 1 is irradiated with the ion beam IB and the electron beam EB1. The driving of the wafer stage 44 is controlled by the wafer stage control unit C3. Therefore, the wafer stage 44 can perform planar movement, vertical movement, rotational movement, and inclinational movement.

The wafer stage 44 is provided with the wafer holder 45 for fixing the wafer 1, so that the wafer 1 is fixed to the wafer stage 44 by the wafer holder 45. A position and orientation of the wafer 1 can be freely changed by driving the wafer stage 44. The wafer stage 44 is moved such that, for example, a desired portion on the wafer 1 is located at the radiation position of the ion beam IB or the radiation position of the electron beam EB1.

The charged particle detector 46 detects charged particles generated when the ion beam IB and the electron beam EB1 radiate the wafer 1 or the lamella 10. In addition, the lamella production device 40 may be provided with a composite charged particle detector capable of detecting not only electrons but also ions as the charged particle detector 46.

The detector control unit C4 controls the charged particle detector 46. The detector control unit C4 includes a circuit or an arithmetic processing unit that arithmetically processes and images a detection signal from the charged particle detector 46.

The detacher 47 is provided in the sample chamber 43 such that the detacher 47 can reach the position where the ion beam IB and the electron beam EB1 are radiated. The driving of the detacher 47 is controlled by the detacher control unit C5. Accordingly, the detacher 47 can perform planar movement, vertical movement, and rotational movement. By driving the detacher 47, the lamella 10 can be taken out from the wafer 1 and the lamella 10 can be transported to the lamella grid 20.

Although nano tweezers are exemplified as the detacher 47 according to the first embodiment, the detacher 47 may be a microprobe. In that case, the microprobe is also controlled by the detacher control unit C5.

The lamella grid stage 48 is provided with the lamella grid holder 49 for fixing the lamella grid 20, so that the lamella grid 20 is fixed to the lamella grid stage 48 by the lamella grid holder 49. The driving of the lamella grid stage is controlled by the lamella grid stage control unit C6. Therefore, the lamella grid stage 48 can perform planar movement, vertical movement, rotational movement, and inclinational movement. The lamella 10 is taken out from the wafer 1 and transported to the lamella grid 20 by the detacher 47.

The integrated control unit C7 can communicate with each of the ion beam column control unit C1, the electron beam column control unit C2, the wafer stage control unit C3, the detector control unit C4, the detacher control unit C5, and the lamella grid stage control unit C6, and controls an operation of the entire lamella production device 40. The integrated control unit C7 controls each of the control units C1 to C6 in accordance with an instruction from a user by the input device 50 or a preset condition, and writes a pattern on the wafer 1 or observes an analysis target by the control units C1 to C6. In addition, the integrated control unit C7 includes a storage unit (not shown) that stores information or the like received from the control units C1 to C6 of the lamella production device 40.

In the present application, in order to make the description easy to understand, each of the control units C1 to C6 is individually shown near a relevant control target. Alternatively, the control units C1 to C6 and the integrated control unit C7 may be collected as one control unit. Therefore, in the present application, the control unit including all or a part of the control units C1 to C7 may be simply referred to as a "control unit". The same applies to the control units C2 to C6 and C8 and control units C9 to C14, which will be described later.

The input device 50 is, for example, a device for the user to input instructions to input information to be analyzed, change radiation conditions of the ion beam IB and the electron beam EB1, and change positions of the wafer stage 44 and the lamella grid stage 48. The input device 50 is, for example, a keyboard or a mouse.

A GUI screen 52 or the like is displayed on the display 51. The GUI screen 52 is a screen for controlling each configuration of the lamella production device 40. When various instructions are input to the GUI screen 52 by the input device 50, the above instructions are transmitted to the integrated control unit C7. The display 51 can display, as the GUI screen 52, for example, a screen for inputting information to be analyzed, a screen showing a state of each configuration of the lamella production device 40, a screen for displaying information (including an image) to be analyzed acquired by observation, an instruction screen for changing the radiation conditions of the ion beam IB and the electron beam EB1, and an instruction screen for changing the positions of the wafer stage 44 and the lamella grid stage 48. One display 51 may be provided, or a plurality of the displays 51 may be provided. The display 51 may have a function of the input device 50 such as a touch panel.

In addition to the above description, a gas deposition unit (not shown) may be mounted in the sample chamber 43. The gas deposition unit includes a control unit that controls the driving. The gas deposition unit is used to produce or mark a protective film on the wafer 1, and stores a depot gas that forms a deposit film by irradiation with charged particle beams. The depot gas can be supplied from a nozzle tip as needed. In addition, the sample chamber 43 may be provided with a decompression device for vacuum exhaust, a cold trap, an optical microscope, and the like. In addition, the sample chamber 43 may be provided with a detector such as a tertiary electron detector, an STEM detector, a backscattering electron detector, or a low energy loss electron detector.

As described above, the lamella production device 40 includes the lamella production mechanism for producing the plurality of lamellae 10 from the wafer 1 and the lamella transport mechanism for transporting (mounting) the plurality of lamellae 10 to the lamella grid 20. In this case, as shown in FIG. 8, the lamella grid 20 on which the lamella 10 is mounted is transferred to the lamella analysis device 70 without going through the lamella transport device 60 to be described later.

However, the lamella production device 40 may not include the lamella transport mechanism. That is, the lamella production device 40 may not include the detacher 47, the detacher control unit C5, the lamella grid stage 48, the lamella grid holder 49, and the lamella grid stage control unit C6 as components.

In that case, the lamella transport mechanism is included in the lamella transport device 60. Since it takes a lot of time to produce the lamella 10 as compared with the transport of the lamella 10, it is more efficient to transport the lamella 10 in the lamella transport device 60. For example, a plurality of the lamella production devices 40 are prepared as a plurality of the lamella production mechanisms in the analysis system 30, and a large number of the lamellae 10 are produced from a plurality of the wafers 1 in the plurality of lamella production devices 40. Meanwhile, the lamella transport device 60 sequentially transports the plurality of lamellae 10 from the wafer 1 processed by a certain lamella production device 40 to the lamella grid 20. By dedicating the lamella transport device 60 as the lamella transport mechanism, a throughput of quality evaluation of the wafer can be improved.

<Lamella Transport Device>

FIG. 10 is a schematic diagram showing the lamella transport device 60 according to the first embodiment. The lamella transport device 60 includes at least the lamella transport mechanism, and is implemented by, for example, the charged particle beam device such as the SEM device including two electron beam columns. Most of the components of the lamella transport device 60 are the same as those of the lamella production device 40, and therefore detailed description thereof is omitted here.

The lamella transport device 60 is obtained by replacing the ion beam column 41 and the ion beam column control unit C1 of the lamella production device 40 with another electron beam column 61 and another electron beam column control unit C8.

Similarly to the electron beam column 42, the electron beam column 61 includes all components necessary for the SEM device, such as an electron source for generating an electron beam (charged particle beam) EB2, a lens for focusing the electron beam EB2, and a deflection system for performing scanning with the electron beam EB2 and shifting the electron beam EB2.

The electron beam column control unit C8 controls the electron beam column 61. For example, the generation of the electron beam EB2 from the electron source and the driving of the deflection system are controlled by the electron beam column control unit C8.

The electron beam EB1 that passed through the electron beam column 42 and the electron beam EB2 had passed through the electron beam column 61 are focused mainly at a cross point CP2 that is an intersection point of the optical axis OA2 of the electron beam column 42 and an optical axis OA3 of the electron beam column 61. Since the lamella transport device 60 includes the electron beam column 42 and the electron beam column 61, the wafer 1 and the lamella grid 20 can be confirmed from two directions.

According to the first embodiment, although two electron beam columns are used, the ion beam column, the optical microscope, or a laser microscope may be used instead of the two electron beam columns as long as images of the wafer 1 and the lamella grid 20 can be observed from the two directions.

The lamella transport device 60 includes the lamella transport mechanism for transporting (mounting) the lamella 10 to the lamella grid 20. In this case, as shown in FIG. 8, the wafer 1 on which the lamella 10 is produced is transferred from the lamella production device 40 to the lamella transport device 60, and the lamella grid 20 on which the lamella 10 is mounted is transferred from the lamella transport device 60 to the lamella analysis device 70.

The lamella grid stage 48 in the lamella transport device 60 is also provided with the lamella grid holder 49 for fixing the lamella grid 20, so that the lamella grid 20 is fixed to the lamella grid stage 48 by the lamella grid holder 49. The driving of the lamella grid stage 48 is controlled by the lamella grid stage control unit C6. Therefore, the lamella grid stage 48 can perform the planar movement, the vertical movement, the rotational movement, and the inclinational movement.

In the wafer stage 44, the plurality of lamellae 10 are taken out of the wafer 1 by the detacher 47, and the plurality of lamellae 10 are sequentially transported to the lamella grid 20 by the detacher 47 in the lamella grid stage 48.

As described above, although the lamella production device 40 may include the lamella transport mechanism, by dedicating the lamella transport device 60 as the lamella transport mechanism, the throughput of the quality evaluation of the wafer can be improved.

<Lamella Analysis Device>

FIG. 11 is a schematic diagram showing the lamella analysis device 70 according to the first embodiment. The lamella analysis device 70 includes at least the lamella analysis mechanism, and is implemented by the charged particle beam device such as the TEM device or the STEM device.

The lamella analysis device 70 includes an electron beam column 71, a sample stage 72, a sample exchange chamber 73, a charged particle detector 74, a charged particle detector 75, an X-ray detector 76, a sample chamber 77, and the control units C9 to C14. In addition, an input device 78 and a display 79 are provided inside or outside the lamella analysis device 70.

A sample SAM can be arranged on the sample stage 72 inside the sample chamber 77. The sample SAM includes the plurality of lamellae 10 and the plurality of lamella grids 20 as shown in FIG. 4, so that a material, a structure, and the like of the analysis portion 11 of the lamella 10 are analyzed by the lamella analysis device 70. The sample SAM is laterally arranged such that a front surface of the analysis portion 11 in FIG. 4 faces the electron beam column 71 in the Y direction.

The electron beam column 71 includes all components necessary as the TEM device or the STEM device, such as an electron source for generating an electron beam, a lens for focusing the electron beam, and a deflection system for performing scanning with the electron beam and shifting the electron beam. The electron beam that passed through the electron beam column 71 radiates the sample SAM.

The electron beam column control unit C9 controls the electron beam column 71. Specifically, the generation of the electron beam by the electron source of the electron beam column 71 and the driving of the deflection system are controlled by the electron beam column control unit C9. According to the first embodiment, as shown in FIG. 11, the electron beam column 71 is arranged perpendicular to the sample SAM. Alternatively, the invention is not limited thereto, and the electron beam column 71 may be arranged in an inclined manner with respect to the sample SAM.

The sample stage 72 is provided in the sample chamber 77 such that the sample SAM can be irradiated with the electron beam. The sample exchange chamber 73 is a place for exchanging the sample SAM inserted into the sample chamber 77. The driving of the sample stage 72 is controlled by the sample stage control unit C10, and the sample stage 72 can perform planar movement, vertical movement, or rotational movement. A position and orientation of the sample SAM can be changed by driving the sample stage 72, and for example, the sample stage 72 is moved such that the sample SAM is located at a radiation position of the electron beam.

The charged particle detector 74 and the charged particle detector 75 detect the charged particles generated when the sample SAM is irradiated with the electron beam. The composite charged particle detector capable of detecting not only the electrons but also the ions may be used as the charged particle detector 74 and the charged particle detector 75.

The detector control unit C11 controls the charged particle detector 74, and the detector control unit C12 controls the charged particle detector 75. The detector control unit C11 and the detector control unit C12 include a circuit or an arithmetic processing unit (not shown) that arithmetically processes and images a detection signal.

The X-ray detector 76 detects an X-ray emitted by the sample SAM. A mass spectrometer may be mounted instead of the X-ray detector 76.

The X-ray detector control unit C13 controls the X-ray detector 76. The X-ray detector control unit C13 includes a circuit or an arithmetic processing unit (not shown) that arithmetically processes and images a detection signal from the X-ray detector 76.

The sample chamber 77 may be provided with a decompression device for vacuum exhaust, a cold trap, an optical microscope, and the like. In addition, the sample chamber 77 may be provided with a detector such as a tertiary electron detector, an STEM detector, a backscattering electron detector, or a low energy loss electron detector.

The integrated control unit C14 can communicate with each of the electron beam column control unit C9, the sample stage control unit C10, the detector control units C11 and C12, and the X-ray detector control unit C13, and controls an operation of the entire lamella analysis device 70. The integrated control unit C14 controls each of the control units in accordance with an instruction from the user by the input device 78 or a preset condition to analyze the sample SAM or the like. In addition, the integrated control unit C14 includes a storage unit (not shown) that stores information or the like received from each of the control units of the lamella analysis device 70.

The input device 78 is a device for the user to input an instruction to change a radiation condition of the electron beam or change a position of the sample stage 72. The input device 78 is, for example, a keyboard or a mouse.

A GUI screen 80 or the like is displayed on the display 79. The GUI screen 80 is a screen for controlling the lamella analysis device 70. When various instructions are input to the GUI screen 80 by the input device 78, the above instructions are transmitted to the integrated control unit C14. The display 79 can display, as the GUI screen 80, for example, a screen for indicating a state of each configuration of the lamella analysis device 70, a screen for displaying sample information (including an image) acquired by the analysis, a screen for inputting information of the sample SAM acquired by the analysis, an instruction screen for changing the radiation condition of the electron beam, and an instruction screen for changing the position of the sample stage 72. One display 79 may be provided, or a plurality of the displays 79 may be provided. The display 79 may have a function of the input device 78 such as a touch panel.

<Network Configuration of Analysis System>

FIG. 12 is a schematic diagram showing a network configuration 31 of the analysis system 30. The semiconductor manufacture line 2, the lamella production device 40, the lamella transport device 60, the lamella analysis device 70, and a server SV that manages data are electrically connected by a network 32. Therefore, various data can be exchanged between them. The server SV can store analysis position data D1, lamella production position data D2, lamella transport position data D3, and the analysis data D4.

The analysis position data D1 is data indicating a position at which a cross-sectional analysis is to be performed on the wafer 1. The lamella production position data D2 is data indicating a position at which the lamella 10 was successfully produced on the wafer 1. The lamella transport position data D3 is data indicating a position of the lamella 10 transported to the lamella grid 20. The analysis data D4 is data including an analysis result including a detection signal of the charged particles or the X-ray from the sample SAM irradiated with the electron beam, an observation image acquired from the detection signal, and the like.

The analysis position data D1, the lamella production position data D2, the lamella transport position data D3, and the analysis data D4 are associated with each other. That is, it is possible to know at which position on the lamella grid 20 the lamella 10 produced at a predetermined position on the wafer 1 is mounted and what the analysis result of the lamella 10 is.

<Processing Flow of Analysis System>

FIG. 13 is a processing flow chart of the analysis system 30 according to the first embodiment. In addition, FIGS. 14 to 16 are perspective views showing main parts of a method for producing the lamella by the lamella production mechanism, and FIGS. 17 to 21 are perspective views showing main parts of a method for transporting the lamella by the lamella transport mechanism.

In step S1, the wafer 1 for which cross-section analysis is to be performed is transferred from the semiconductor manufacture line 2 to the lamella production device 40, and the wafer 1 is arranged on the wafer stage 44 of the lamella production device 40.

In step S2, the lamella production device 40 acquires the analysis position data D1 corresponding to the received wafer 1 from the server SV.

In step S3, the wafer stage 44 is moved to an analysis position based on the analysis position data D1. Thereafter, as shown in FIGS. 14 to 16, the lamella 10 is produced from a part of the wafer 1.

First, as shown in FIG. 14, the lamella production device 40 etches the periphery of a region on the wafer 1 for which the cross-sectional analysis is to be performed by the charged particle beam such as the ion beam IB to produce an outer shape of the lamella 10. Next, the analysis portion 11 is produced on the upper portion of the lamella 10 by etching a part of the lamella 10. The analysis portion 11 is subjected to, for example, a finished surface treatment for later analysis.

Here, the lamella 10 is connected to the wafer 1 by a connection portion 1*a*. In other words, at this point, the lamella 10, the connection portion 1*a*, and the wafer 1 are integrated, and the lamella 10 is separated from the connection portion 1*a* when the lamella 10 is transported.

Next, as shown in FIG. 15, the wafer stage 44 is inclined and irradiated with the charged particle beam such as the ion beam IB to etch the bottom portion of the lamella 10. Accordingly, as shown in FIG. 16, the cutout portion 12 of the lamella 10 is produced. The structure of the lamella 10 in this state is the same as the structure described with reference to FIGS. 5 to 7 above, except for the connection portion 1*a*. Therefore, for the detailed structure of the lamella 10, refer to the above description of FIGS. 5 to 7.

According to the first embodiment, the cutout portion 12 is etched after the lamella 10 in FIG. 14 is produced. Alternatively, the cutout portion 12 may be etched during a production step of FIG. 14.

The movement of the wafer stage 44 and the production of the lamella 10 are performed on all the regions corresponding to the analysis position data D1 on the wafer 1 being processed. That is, step S3 is repeated until the production of all the lamellae 10 corresponding to the analysis position data D1 is completed.

In step S4, among all the lamellae 10 produced in step S3, the positions of the plurality of lamellae 10 that were successfully produced are transmitted to the server SV and stored in the server SV as the lamella production position data D2.

In step S5, the wafer 1 on which the plurality of lamellae are produced is transferred from the lamella production device 40 to the lamella transport device 60. That is, the wafer 1 is transferred from the lamella production mechanism to the lamella transport mechanism.

As described above, when the lamella production device 40 includes the lamella production mechanism and the lamella transport mechanism, steps including step S5 and the following steps S6 to S9 are performed by the lamella production device 40.

In step S6, the lamella transport device 60 acquires the lamella production position data D2 corresponding to the received wafer 1 from the server SV.

In step S7, the wafer stage 44 is moved to a lamella production position based on the lamella production position data D2. Thereafter, as shown in FIGS. 17 to 21, the plurality of lamellae 10 are transported to the lamella grid 20.

First, in the lamella transport device 60, an image formed by the electron beam column 42 or the electron beam column 61 is confirmed, and then, as shown in FIG. 17, the lamella 10 produced on the wafer 1 is held by the detacher 47. Here, the detacher 47 is the nano tweezers, and the lamella 10 is grasped by the nano tweezers. At this time, it is desirable to operate the nano tweezers such that the analysis portion 11 is not grasped.

Next, as shown in FIG. 18, the lamella 10 is separated from the connection portion 1*a* and lifted off from the wafer 1 by lowering the wafer stage 44 or raising the detacher 47. Therefore, the lamella 10 is acquired from a part of the wafer 1.

Next, the lamella grid stage 48 is moved to a position where an image can be acquired by the electron beam column 42 and the electron beam column 61, and a position of the detacher 47 and the position of the lamella grid stage 48 are adjusted. Then, as shown in FIG. 19, the lamella 10 held by the detacher 47 is moved to directly above the support portion 22 (support columns 22*a* to 22*d*) on the lamella grid 20.

Next, the lamella 10 is inserted into the support portion 22 as shown in FIG. 20 while confirming the image formed by the electron beam column 42. Specifically, the lamella 10 is inserted between the support column 22*a* and the support column 22*b* and between the support column 22*c* and the support column 22*d*. After the lamella 10 is inserted to a predetermined position, the detacher 47 is released from the grip and the detacher 47 is retracted. As described above, the first lamella 10 is transported from the wafer 1 to the lamella grid 20.

Next, the second lamella 10 is acquired from the wafer 1 by the same method as that of the first lamella. Then, as shown in FIG. 21, the second lamella 10 is moved to directly above the support portion 22 of the lamella grid 20, and the lamella 10 is inserted into the support portion 22. Accordingly, the second lamella 10 is transported from the wafer 1 to the lamella grid 20.

As described in FIGS. 4 to 7, since the cutout portion 12 is provided in the lamella 10, the bottom portion of the upper lamella 10 is not in contact with the analysis portion 11 of the lower lamella 10. Therefore, the analysis portion 11 can be prevented from damage. In addition, the plurality of lamellae 10 can be mounted on the support portion 22, and the lamella grid 20 including the plurality of support portions 22 can be provided. In addition, since no deposition is used when the lamella 10 is transported to the lamella grid 20, the lamella 10 can be transported in a short time, and the sample contamination can also be reduced.

According to the first embodiment, although two lamellae 10 are mounted on the support portion 22, two or more lamellae 10 can also be mounted on the support portion 22 depending on a shape (height) of the support portion 22.

The movement of the wafer stage 44 and the transport of the lamella 10 are performed on all the regions corresponding to the lamella production position data D2 on the wafer 1. That is, step S7 is repeated until the transport of all the lamellae 10 corresponding to the lamella production position data D2 is completed. In addition, when an allowable range of one support portion 22 is exceeded, the subsequent lamella 10 is transported to the other support portions 22 on the lamella grid 20. Further, when an allowable range of one lamella grid 20 is exceeded, the following subsequent lamellae 10 are transported to the support portion 22 on the other lamella grids 20.

After step S7 described above, in step S8, the position on the lamella grid 20 of the lamella 10 successfully transported among the lamellae 10 transported to the lamella grid 20 is transmitted to the server SV and stored in the server SV as the lamella transport position data D3.

In step S9, the wafer 1 from which the plurality of lamellae 10 are transported is discharged from the lamella transport device 60. Thereafter, if necessary, the discharged wafer 1 may be returned to the semiconductor manufacture line 2.

In step S10, the lamella grid 20 on which the plurality of lamellae 10 are mounted is transferred from the lamella transport device 60 to the lamella analysis device 70 as the sample SAM.

In step S11, the lamella analysis device 70, which is the lamella analysis mechanism, acquires the lamella transport position data D3 corresponding to the received lamella grid 20 from the server SV. The lamella analysis device 70 analyzes the lamella 10 (analysis portion 11) prepared as described above.

In the following steps S12 and S13, a method for analyzing the lamella 10 by the lamella analysis device 70 will be described. Here, a case in which the lamella analysis device 70 is the TEM device will be described.

In step S12, the sample stage 72 is moved to a transport position of the sample SAM to be analyzed based on the lamella transport position data D3. FIG. 22 is a front view of the sample SAM arranged on the sample stage 72, and the sample SAM is laterally arranged such that the front surface of the sample SAM (analysis portion 11 of the lamella 10) faces the electron beam column 71 in the Y direction.

In the sample SAM, substantially, the analysis portion 11 of each of the plurality of lamellae 10 is an analysis target portion, and the lamella grid 20 is a holder that supports the plurality of lamellae 10. Herein, the lamella grid 20 and the plurality of lamellae 10 are collectively described as the sample SAM. In addition, the analysis portion 11 and the cutout portion 12 do not overlap the support portion 22 and are exposed from the support portion 22 in the plan view seen from the Y direction so that the analysis portion 11 is not blocked by the support portion 22.

At the time of analysis of the analysis portion 11, first, an image of the sample SAM is acquired at a low magnification, and position information (coordinates) on the sample stage 72 in which the analysis portion 11 of the lamella 10 is at a center of the field of view is acquired. Next, the sample stage 72 is moved to the coordinates, and then the cross-sectional analysis of the analysis portion 11 is performed at a high magnification.

A general method can be used as a method for analyzing the analysis portion 11. For example, by irradiating the analysis portion 11 with the electron beam from the electron beam column 71, the charged particle detector 74 and the charged particle detector 75 can analyze the charged particles emitted from the analysis portion 11. In addition, the X-ray detector 76 can analyze the X-rays emitted from the analysis portion 11.

When two lamellae 10 are mounted on one support portion 22, it is possible to acquire the position information on the sample stages 72 of both the analysis portion 11 of the first lamella 10 and the analysis portion 11 of the second lamella 10 when the image is acquired at the low magnification. Therefore, it is not necessary to alternately perform the low magnification and the high magnification, and time for the cross-sectional analysis can be shortened.

Specifically, after the sample stage 72 is moved to coordinates of the analysis portion 11 of the first lamella 10 and the high magnification cross-sectional analysis is completed in the analysis portion 11 of the first lamella 10, the sample stage 72 is moved to coordinates of the analysis portion 11 of the second lamella 10, and the high magnification cross-sectional analysis is performed in the analysis portion of the second lamella 10 without performing the low magnification cross-sectional analysis again.

Even when three or more lamellae 10 are mounted on one support portion 22, it is sufficient to acquire the low magnification images once in the same manner, and thus the time for the cross-sectional analysis can be shortened.

As described above, at the time of the analysis of a plurality of the analysis portions 11 included in the analysis target portion of the sample SAM, an operation of specifying positions of the plurality of analysis portions 11 is performed at the low magnification. Alternatively, when a structure of the sample SAM according to the first embodiment is used, the positions of the plurality of analysis portions 11 can be easily specified.

When the sample SAM is observed at the low magnification, an image including, for example, a dark region 90 and a bright region surrounded by the dark region 90 as shown in FIG. 23 can be acquired. The analysis portion 11 having a small width in the Y direction and the cutout portion 12 that is a through hole are displayed brightly as the bright region. That is, the bright region includes a large area region 12*a* corresponding to the cutout portion 12 and a small area region 11*a* corresponding to the analysis portion 11, and the large area region 12*a* and the small area region 11*a* are in contact with each other. In other words, the small area region 11*a* is displayed as a convex portion in a part of the large area region 12*a*.

Here, it is possible to easily specify the small area region 11*a* protruding from the large area region 12*a* by searching for the small area region 11*a* along a boundary between the large area region 12*a* and the dark region 90, and it is specified that a position of the small area region 11*a* is the position of the analysis target portion (analysis portion 11) of the sample SAM. When the lamella 10 mounted on the uppermost portion of the support portion 22 is observed, a region above the lamella 10 is a space in which no lamella 10 or lamella grid 20 is present, and thus the space is the large area region 12*a*. Similarly, in this case, the analysis target portion of the sample SAM can be easily specified by searching for the small area region 11*a* along the boundary between the large area region 12*a* and the dark region 90.

When the lamella 10 is not provided with the cutout portion 12, that is, when no large area region 12*a* is present, only the small area region 11*a* is present as the bright region in the bright-dark image. In this case, the small area region 11*a* may not be clearly discriminated on the image, and operation time for specifying the position of the analysis portion 11 may increase. Regarding this, according to the first embodiment, the large area region 12*a* that is relatively easy to be found is present. Therefore, first, a rough position where the analysis portion 11 is expected to be near the large area region 12*a* may be specified, and then the small area region 11*a*, which is the convex portion, may be searched for along the boundary between the large area region 12*a* and the dark region 90. Therefore, the position of the analysis portion 11 can be easily specified, and the operation time can be shortened.

According to the method for analyzing the lamella 10 according to the first embodiment, since the cutout portion 12 is present, it is possible to perform the cross-sectional analysis in a state in which no other lamella 10 is present near the analysis portion 11 to be observed. Therefore, a chance of being affected by a component of the other lamella 10 at the time of cross-sectional analysis is reduced, an accuracy of an observation image acquired by the charged particle detector 74 and the charged particle detector 75 can be further improved. In addition, an accuracy of elemental analysis acquired by the X-ray detector 76 can be improved.

Thereafter, in step S13, an analysis result of the analysis portion 11 of the lamella 10 acquired by the cross-section analysis is transmitted to the server SV and stored in the server SV as the analysis data D4.

Although the invention is described in detail based on the above embodiment as described above, the invention is not limited to the above embodiment and various modifications can be made without departing from the scope of the invention.

REFERENCE SIGN LIST

1 wafer
1*a* connection portion
2 semiconductor manufacture line
10 lamella
11 analysis portion
11*a* small area region (bright region)
12 cutout portion
12*a* large area region (bright region)
20 lamella grid
21 substrate
22 support portion
22*a* to 22*d* support column
30 analysis system
31 network configuration
32 network
40 lamella production device
41 ion beam column
42 electron beam column
43 sample chamber
44 wafer stage
45 wafer holder
46 charged particle detector
47 detacher
48 lamella grid stage
49 lamella grid holder

50 input device
51 display
52 GUI screen
60 lamella transport device
61 electron beam column
70 lamella analysis device
71 electron beam column
72 sample stage
73 sample exchange chamber
74 charged particle detector
75 charged particle detector
76 X-ray detector
77 sample chamber
78 input device
79 display
80 GUI screen
90 dark region
C1 ion beam column control unit
C2 electron beam column control unit
C3 wafer stage control unit
C4 detector control unit
C5 detacher control unit
C6 lamella grid stage control unit
C7 integrated control unit
C8 electron beam column control unit
C9 electron beam column control unit
C10 sample stage control unit
C11 detector control unit
C12 detector control unit
C13 X-ray detector control unit
C14 integrated control unit
CP1, CP2 cross point
D1 analysis position data
D2 lamella production position data
D3 lamella transport position data
D4 analysis data
EB1, BE2 electron beam (charged particle beam)
IB ion beam (charged particle beam)
OA1 to OA3 optical axis
S1 to S13 step
SV server
W1, W2 width

The invention claimed is:

1. A method for producing a lamella, the method comprising:

producing the lamella including an analysis portion and a cutout portion by etching a part of a wafer, wherein a width of the lamella in a first direction is smaller than a width of the lamella in a second direction orthogonal to the first direction and a width of the lamella in a third direction orthogonal to the first direction and the second direction, a width of the analysis portion is smaller than a width of the lamella around the analysis portion in the first direction, the cutout portion includes a hole penetrating the lamella in the first direction, and the analysis portion and the cutout portion are separated from each other in the second direction, and the analysis portion overlaps the cutout portion in a plan view seen from the second direction.

2. The method for producing a lamella according to claim 1, wherein a width of the cutout portion is larger than a width of the analysis portion in the third direction.

3. The method for producing a lamella according to claim 1, wherein the etching is performed by a charged particle beam device provided with either or both of an ion beam column and an electron beam column.

4. An analysis system comprising:

a lamella production mechanism; and a lamella transport mechanism, wherein the analysis system is configured to (a) produce a first lamella including at least a first analysis portion and a first cutout portion and a second lamella including a second analysis portion and a second cutout portion by etching a part of a wafer in the lamella production mechanism; and (b) sequentially transport the first lamella and the second lamella from the wafer to a lamella grid in the lamella transport mechanism, a width of the first lamella in a first direction is smaller than a width of the first lamella in a second direction orthogonal to the first direction and a width of the first lamella in a third direction orthogonal to the first direction and the second direction, a width of the first analysis portion is smaller than a width of the first lamella around the first analysis portion in the first direction, the first cutout portion includes a hole penetrating the first lamella in the first direction, the first analysis portion and the first cutout portion are separated from each other in the second direction, a width of the second lamella in the first direction is smaller than a width of the second lamella in the second direction and a width of the second lamella in the third direction, a width of the second analysis portion is smaller than a width of the second lamella around the second analysis portion in the first direction, the second cutout portion includes a hole penetrating the second lamella in the first direction, the second analysis portion and the second cutout portion are separated from each other in the second direction, the lamella grid includes a substrate and a support portion that protrudes from a surface of the substrate in the second direction and on which the first lamella and the second lamella are configured to be mounted, and in the (b), the first lamella and the second lamella are transported to the lamella grid such that the second cutout portion and the first analysis portion are adjacent to each other in the second direction and overlap each other in a plan view seen from the second direction.

5. The analysis system according to claim 4, wherein the first analysis portion and the second analysis portion overlap the first cutout portion and the second cutout portion, respectively, in the plan view seen from the second direction, and a width of the first cutout portion and a width of the second cutout portion are larger than a width of the first analysis portion and a width of the second analysis portion, respectively, in the third direction.

6. The analysis system according to claim 4, wherein the support portion includes a first support column, a second support column, a third support column, and a fourth support column that protrude from the surface of the substrate in the second direction, and in the (b), the first lamella and the second lamella are sandwiched between the first support column and the second support column and between the third support column and the fourth support column.

7. The analysis system according to claim 6, wherein the first analysis portion and the second analysis portion do not overlap with the first support column, the second support column, the third support column, and the fourth support column in a plan view seen from the first direction.

8. The analysis system according to claim 4, wherein the (a) is performed using an ion beam column or a first electron beam column provided in the lamella production mechanism, and the (b) is performed using a detacher provided in the lamella transport mechanism.

9. The analysis system according to claim 8, wherein the lamella production mechanism and the lamella transport mechanism are provided in separate charged particle beam devices.

10. The analysis system according to claim 8, wherein the lamella production mechanism and the lamella transport mechanism are provided in the same charged particle beam device.

11. The analysis system according to claim 8, further comprising:

a lamella analysis mechanism including a second electron beam column and a sample stage, wherein the analysis system is further configured to (c) analyze the first analysis portion and the second analysis portion in a state in which the lamella grid on which the first lamella and the second lamella are mounted is arranged on the sample stage such that the first analysis portion and the second analysis portion face the second electron beam column in the first direction in the lamella analysis mechanism.

12. A method for analyzing a sample using a transmission electron microscope, comprising:

(a) arranging the sample including an analysis target portion on a sample stage of the transmission electron microscope;

(b) acquiring an image of the sample at a low magnification after the (a), and specifying a position of the analysis target portion of the sample based on the image; and (c) analyzing the analysis target portion of the sample at a high magnification after the (b), wherein the image acquired in the (b) has a dark region and a bright region surrounded by the dark region, the bright region includes a first region and a second region having an area smaller than an area of the first region and in contact with the first region, and a position of the second region protruding from the first region is specified as the position of the analysis target portion by searching for the second region along a boundary between the first region and the dark region.

13. The method for analyzing a sample according to claim 12, wherein the sample includes at least a first lamella including a first analysis portion and a first cutout portion, a second lamella including a second analysis portion and a second cutout portion, and a lamella grid on which the first lamella and the second lamella are mounted such that the second cutout portion and the first analysis portion are adjacent to each other, and the position of the analysis target portion includes a position of the first analysis portion and a position of the second analysis portion.

14. The method for analyzing a sample according to claim 13, wherein a width of the first lamella in a first direction is smaller than a width of the first lamella in a second direction orthogonal to the first direction and a width of the first lamella in a third direction orthogonal to the first direction and the second direction, a width of the first analysis portion is smaller than a width of the first lamella around the first analysis portion in the first direction, the first cutout portion includes a hole penetrating the first lamella in the first direction, the first analysis portion and the first cutout portion are separated from each other in the second direction, a width of the second lamella in the first direction is smaller than a width of the second lamella in the second direction and a width of the second lamella in the third direction, a width of the second analysis portion is smaller than a width of the second lamella around the second analysis portion in the first direction, the second cutout portion includes a hole penetrating the second lamella in the first direction, the second analysis portion and the second cutout portion are separated from each other in the second direction, the first lamella and the second lamella are mounted on the lamella grid such that the second cutout portion and the first analysis portion are adjacent to each other in the second direction and overlap each other in a plan view seen from the second direction, the first analysis portion and the second analysis portion overlap the first cutout portion and the second cutout portion, respectively, in the plan view seen from the second direction, and a width of the first cutout portion and a width of the second cutout portion are larger than a width of the first analysis portion and a width of the second analysis portion, respectively, in the third direction, and the first analysis portion and the second analysis portion face an electron beam column of the transmission electron microscope in the first direction.

* * * * *